US009825167B2

(12) United States Patent
Matsuura et al.

(10) Patent No.: US 9,825,167 B2
(45) Date of Patent: Nov. 21, 2017

(54) METHOD OF MANUFACTURING A P-CHANNEL POWER MOSFET

(71) Applicant: Renesas Electronics Corporation, Koutou-ku, Tokyo (JP)

(72) Inventors: Hitoshi Matsuura, Kanagawa (JP); Yoshito Nakazawa, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/236,678

(22) Filed: Aug. 15, 2016

(65) Prior Publication Data
US 2016/0351703 A1 Dec. 1, 2016

Related U.S. Application Data

(63) Continuation of application No. 13/039,294, filed on Mar. 2, 2011, now abandoned.

(30) Foreign Application Priority Data

Mar. 3, 2010 (JP) ................. 2010-046452

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0619* (2013.01); *H01L 29/407* (2013.01); *H01L 29/4983* (2013.01); *H01L 29/78* (2013.01)

(58) Field of Classification Search
CPC . H01L 29/7813; H01L 29/78; H01L 29/0619; H01L 29/402; H01L 29/407;
(Continued)

(56) References Cited

U.S. PATENT DOCUMENTS 5,177,572 A 1/1993 Murakami
5,843,841 A * 12/1998 Izawa ............... H01L 21/76895
257/E21.59
(Continued)

FOREIGN PATENT DOCUMENTS

JP 2002-528916 T 9/2002
JP 2005-203391 A 7/2005
(Continued)

OTHER PUBLICATIONS

Stojadinovic et al. Impact of Negative Bias Temperature Instabilities on Lifetime in p-channel P?ower VDMOSFET, IEEE, TELSIKS 2007, Serbia, Nis, Septemper 26-28, 2007, pp. 275-282.*
(Continued)

*Primary Examiner* — Galina Yushina
(74) *Attorney, Agent, or Firm* — Shapiro, Gabor and Rosenberger, PLLC

(57) ABSTRACT

In characteristic test measurements of double-gate-in-trench p-channel power MOSFETs each having a $p^+$ polysilicon gate electrode and a $p^+$ field plate electrode in a trench, which were fabricated according to common design techniques, it has been found that, under conditions where a negative gate bias is applied continuously at high temperature with respect to the substrate, an absolute value of threshold voltage tends to increase steeply after the lapse of a certain period of stress application time. To solve this problem, the present invention provides a p-channel power MOSFET having an n-type polysilicon linear field plate electrode and an n-type polysilicon linear gate electrode in each trench part thereof.

15 Claims, 30 Drawing Sheets

(51) Int. Cl.
*H01L 29/40* (2006.01)
*H01L 29/49* (2006.01)

(58) Field of Classification Search
CPC ............. H01L 29/4983; H01L 29/4236; H01L 29/66704; H01L 29/66734
See application file for complete search history.

(56) References Cited

U.S. PATENT DOCUMENTS

| | | | |
|---|---|---|---|
| 5,907,776 A | 5/1999 | Hshieh | |
| 5,917,216 A | 6/1999 | Floyd | |
| 6,245,607 B1 | 6/2001 | Tang | |
| 6,878,996 B2 | 4/2005 | Rothleitner | |
| 7,005,351 B2 | 2/2006 | Henninger et al. | |
| 7,659,575 B2 | 2/2010 | Matsuura et al. | |
| 8,476,702 B2* | 7/2013 | Izumi | H01L 29/0696 257/331 |
| 2002/0158277 A1* | 10/2002 | Harada | H01L 27/0922 257/288 |
| 2002/0164858 A1* | 11/2002 | Sayama | H01L 21/823807 438/289 |
| 2004/0089910 A1* | 5/2004 | Hirler | H01L 29/407 257/500 |
| 2004/0214384 A1* | 10/2004 | Chi | G11C 11/412 438/199 |
| 2005/0184717 A1 | 8/2005 | Walters | |
| 2006/0091455 A1 | 5/2006 | Adan | |
| 2006/0108618 A1* | 5/2006 | Ahn | H01L 27/14609 257/292 |
| 2006/0124996 A1* | 6/2006 | Mizokuchi | H01L 29/0865 257/330 |
| 2006/0157779 A1 | 7/2006 | Kachi et al. | |
| 2006/0261391 A1* | 11/2006 | Nakazawa | H01L 27/0255 257/296 |
| 2009/0014719 A1* | 1/2009 | Shimizu | H01L 27/0605 257/49 |
| 2009/0057754 A1* | 3/2009 | Kraft | H01L 21/823437 257/328 |
| 2009/0140343 A1 | 6/2009 | Feilchenfeld | |
| 2009/0218619 A1 | 9/2009 | Hebert | |
| 2010/0055892 A1* | 3/2010 | Poelzl | H01L 29/66666 438/595 |
| 2010/0123188 A1* | 5/2010 | Venkatraman | H01L 29/407 257/330 |

FOREIGN PATENT DOCUMENTS

| | | |
|---|---|---|
| JP | 2006-128506 A | 5/2006 |
| JP | 2006-202931 A | 8/2006 |
| JP | 2009-032951 A | 2/2009 |
| WO | WO-00/25365 | 5/2000 |

OTHER PUBLICATIONS

Huard et al. New characterizetion and modeling approach for NBTI degradation from transistor to product level, IEEE, STMicroelectronics, 2007, pp. 797-800.*
Office Action dated Jul. 28, 2016, in Japanese Patent Application No. 2015-130572.
Office Action dated Dec. 19, 2013, in Japanese Patent Application No. 2010-046452.
Sze. Semiconductor Devices. Physics and Technology, 2nd Edition, pp. 54-55.

* cited by examiner

US 9,825,167 B2

METHOD OF MANUFACTURING A P-CHANNEL POWER MOSFET

CROSS-REFERENCE TO RELATED APPLICATIONS

The disclosure of Japanese Patent Application No. 2010-46452 filed on Mar. 3, 2010 including the specification, drawings and abstract is incorporated herein by reference in its entirety.

BACKGROUND OF THE INVENTION

The present invention relates to semiconductor devices, and more particularly to a semiconductor integrated circuit device technique that is effectively applicable to a MOSFET device.

In Japanese Unexamined Patent Publication No. 2006-202931 (Patent Document 1) or U.S. Patent Application Publication No. 2006-157779 (Patent Document 2) corresponding thereto, there is disclosed an n-channel MOSFET wherein a field plate electrode is disposed under an ordinary trench gate electrode.

RELATED ART REFERENCES

Patent Documents

Patent Document 1:
  Japanese Unexamined Patent Publication No. 2006-202931
Patent Document 2:
  U.S. Patent Application Publication No. 2006-157779

SUMMARY OF THE INVENTION

In the engineering development of power MOSFETs, it is common practice to design an n-channel power MOSFET featuring a superior ON-resistance characteristic with priority placed thereon first, and then proceed to the designing of a p-channel power MOSFET on the basis of the n-channel power MOSFET structure concerned through configurational rearrangement by n-to-p type replacement. Hence, in order to formulate a p-channel power MOSFET wherein a field plate electrode is disposed under an ordinary trench gate electrode, the present inventors have fabricated double-gate-in-trench p-channel power MOSFETs each having a $p^+$ polysilicon gate electrode (intrinsic gate electrode) and a $p^+$ field plate electrode (field plate gate electrode) in a trench on the basis of the n-channel power MOSFET structure concerned according to common design techniques. In characteristic test measurements of these double-gate-in-trench p-channel power MOSFETs each having a $p^+$ polysilicon gate electrode and a $p^+$ field plate electrode in a trench, it has been found that there are disadvantageous problems in comparison with the n-channel power MOSFET structure concerned. More specifically, in a gate bias stress test, a poor reliability condition such as NBTI (negative bias temperature instability) took place in the above p-channel power MOSFETs while no problematic condition was encountered in the n-channel device design. That is, when a negative gate bias was applied continuously at high temperature with respect to the substrate of the p-channel power MOSFET under test, an interface state or an oxide film trap occurred due to high-temperature/high-bias stress. Thus, in the double-gate-in-trench p-channel power MOSFET structure with a $p^+$ polysilicon gate electrode and a $p^+$ field plate electrode in a trench, an absolute value of threshold voltage (Vth) or ON resistance tends to increase steeply after the lapse of a certain period of stress application time, which is regarded as a phenomenon of deterioration with time or aging.

The present invention is intended to overcome the disadvantages mentioned above.

It is therefore an object of the present invention to provide a p-channel power MOSFET having higher reliability in performance.

The above and other objects, novel features, and advantages of the present invention will become more apparent from the following detailed description with reference to the accompanying drawings.

The representative aspects of the present invention are briefed below:

In carrying out the present invention and according to one aspect thereof, there is provided a p-channel power MOSFET having an n-type polysilicon linear field plate electrode and an n-type polysilicon linear gate electrode in each trench thereof.

To sum up, the following advantageous effect is provided according to the representative aspects of the present invention:

A p-channel power MOSFET configured to have an n-type polysilicon linear field plate electrode and an n-type polysilicon linear gate electrode in each trench thereof in accordance with the present invention is capable of providing the advantageous effect of significantly reducing the degree of deterioration with time in terms of threshold voltage (Vth).

DETAILED DESCRIPTION OF THE PREFERRED EMBODIMENTS

Overviews of the Preferred Embodiments

Figure 1:
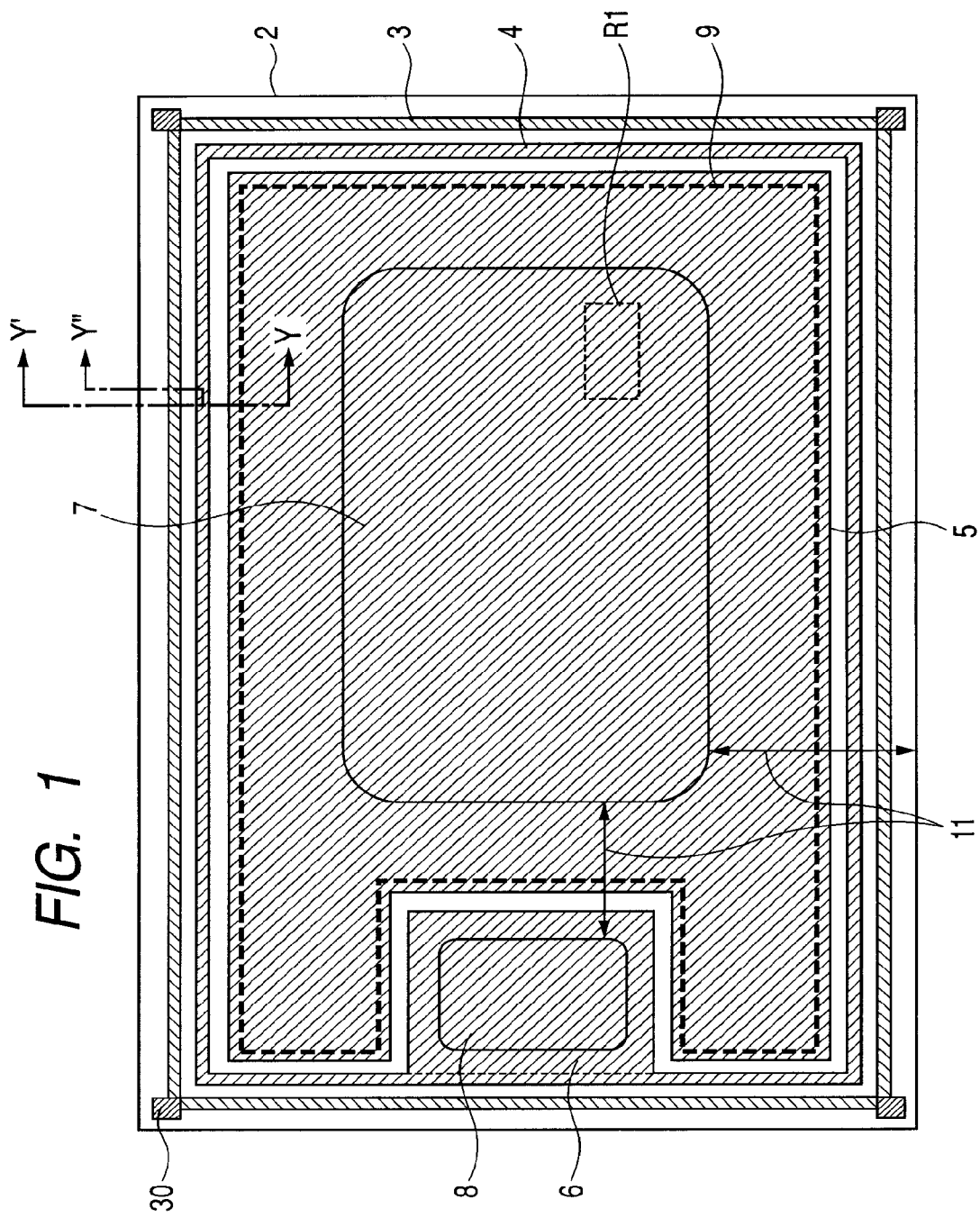
FIG. 1 is a chip top view of a double-gate-in-trench p-channel power MOSFET according to first and second preferred embodiments of the present invention.

First, the present invention will be described below regarding the overviews of representative preferred embodiments thereof.

1. In accordance with a representative preferred embodiment of the present invention, there is provided a p-channel power MOSFET comprising: (a) a silicon-based semiconductor substrate having first and second principal surface sides; and (b) a multiplicity of linear trenches disposed in the first principal surface side. Each of the linear trenches includes: (b1) an n-type polysilicon linear field plate electrode; and (b2) an n-type polysilicon linear gate electrode disposed over and along the n-type polysilicon linear field plate electrode.

2. In the p-channel power MOSFET mentioned in item 1, the second principal surface side of the silicon-based semiconductor substrate is provided with a p-type silicon single-crystal substrate region.

3. In the p-channel power MOSFET mentioned in item 2, the first principal surface side of the silicon-based semiconductor substrate is provided with a p-type silicon epitaxial region having a dopant concentration lower than that of the p-type silicon single-crystal substrate region.

4. In the p-channel power MOSFET mentioned in any one of items 1 to 3, the second principal surface side of the silicon-based semiconductor substrate is provided with a metal drain electrode.

5. In the p-channel power MOSFET mentioned in any one of items 1 to 4, the n-type polysilicon linear field plate electrode and the n-type polysilicon linear gate electrode are electrically coupled to each other.

6. In the p-channel power MOSFET mentioned in any one of items 1 to 5, the n-type polysilicon linear field plate electrode and the n-type polysilicon linear gate electrode are coupled mutually outside each linear trench.

7. In the p-channel power MOSFET mentioned in any one of items 1 to 6, the n-type polysilicon linear field plate electrode and the n-type polysilicon linear gate electrode are coupled mutually via a metal wiring line outside each linear trench.

8. In the p-channel power MOSFET mentioned in any one of items 1 to 7, the arrangement thereof is made for motor driving use.

9. In the p-channel power MOSFET mentioned in any one of items 1 to 8, the arrangement thereof is made for use as a low-threshold-voltage device.

10. In accordance with another representative preferred embodiment of the present invention, there is provided a p-channel power MOSFET comprising: (a) a silicon-based semiconductor substrate having first and second principal surface sides; and (b) a multiplicity of linear trenches disposed in the first principal surface side. Each of the linear trenches includes: (b1) an n-type polysilicon linear field plate electrode; and (b2) a p-type polysilicon linear gate electrode disposed over and along the n-type polysilicon linear field plate electrode.

11. In the p-channel power MOSFET mentioned in item 10, the second principal surface side of the silicon-based semiconductor substrate is provided with a p-type silicon single-crystal substrate region.

12. In the p-channel power MOSFET mentioned in item 11, the first principal surface side of the silicon-based semiconductor substrate is provided with a p-type silicon epitaxial region having a dopant concentration lower than that of the p-type silicon single-crystal substrate region.

13. In the p-channel power MOSFET mentioned in any one of items 10 to 12, the second principal surface side of the silicon-based semiconductor substrate is provided with a metal drain electrode.

14. In the p-channel power MOSFET mentioned in any one of items 10 to 13, the n-type polysilicon linear field plate electrode and the p-type polysilicon linear gate electrode are electrically coupled to each other.

15. In the p-channel power MOSFET mentioned in any one of items 10 to 14, the n-type polysilicon linear field plate electrode and the p-type polysilicon linear gate electrode are coupled mutually outside each linear trench.

16. In the p-channel power MOSFET mentioned in any one of items 10 to 15, the n-type polysilicon linear field plate electrode and the p-type polysilicon linear gate electrode are coupled mutually via a metal wiring line outside each linear trench.

17. In the p-channel power MOSFET mentioned in any one of items 10 to 16, the arrangement thereof is made for motor driving use.

18. In the p-channel power MOSFET mentioned in any one of items 10 to 17, the arrangement thereof is made for use as a low-threshold-voltage device.

Descriptive Forms, Basic Terms, and Notational Representations in the Present Document 1. In the following detailed description of the preferred embodiments of the present invention, some aspects of the present invention are separately described in a plurality of sections for the sake of convenience in explanation as required. It is to be noted, however, that these sections are not independent mutually unless otherwise specified, i.e., each section is wholly or partly associated with another section in terms of implementation in such a fashion as a representative partial form, a specific arrangement, or a modified embodiment. For the sake of simplicity, no duplicative description is given regarding identical or similar parts unless otherwise necessary in particular. It is also to be noted that some component elements and quantities thereof indicated in the following description of the preferred embodiments are not necessarily mandatory unless otherwise specified, unless limited thereto in theory, or unless apparent from context.

Further, the term "transistor", "semiconductor device" or "semiconductor integrated circuit device" in the present document signifies any one of various transistors (active elements) or any one of various integrated circuits incorporating transistors and other elements such as resistors and capacitors in the form of a semiconductor chip (e.g., single-crystal silicon substrate chip). As a representative of various transistors, there can be mentioned a MOSFET (Metal Oxide Semiconductor Field Effect Transistor) which is included in the category of MISFETs (Metal Insulator Semiconductor Field Effect Transistors). The term "MOSFET" as used herein denotes a field-effect transistor having any insulating film other than an oxide film as a gate insulating film thereof as well as a field-effect transistor having an oxide film as a gate insulating film thereof.

2. Furthermore, in the present document, a descriptive phrase regarding materials and compositions such as "X comprising A" or the like should not be construed to preclude an item containing any element other than A as one of components unless otherwise specified or unless apparent from context. That is, in terms of components, the phrase "X comprising A" signifies "X including A as one of major components". Thus, it will be obvious to those skilled in the art that, for example, the term "silicon part" does not indicate a limitation to a pure silicon item, but signifies an item formed of SiGe alloy, multi-component alloy containing silicon as a major component, or silicon-based alloy containing various additives. Likewise, the term "silicon oxide film" or "silicon-oxide-based insulating film" is to be understood to signify any one of various oxide films formed by using materials such as; undoped silicon dioxide (relatively pure silicon), FSG (fluorosilicate glass), TEOS-based silicon oxide, SiOC (silicon oxicarbide), carbon-dosed silicon oxide, OSG (organosilicate glass), PSG (phosphorus silicate glass), and BPSG (borophosphosilicate glass). With any of these materials, an oxide film may be prepared in the form of a thermally-oxidized film, CVD-oxidized film, SOG (spin on glass) film, NCS (nano-clustering silica) film, or any other coated type of silicon oxide film. Further, as various kinds of silicon oxide films, there may be included a silica-based low-k insulating film with pores introduced in a material equivalent or similar to one of those listed above (porous insulating film), a composite film prepared by using a silicon-based insulating film containing a material equivalent or similar to one of those listed above as a major component thereof, etc.

3. Regarding such conditions as formation patterns, positions, and attributes of elements, the preferred embodiments are demonstrated herein for illustrative purposes only. It is to be understood that the present invention is not limited to these preferred embodiments unless otherwise specified or unless apparent from context.

4. Still further, in reference to a certain numerical value or quantity indicated herein, it is to be recognized that a value larger than or smaller than the indicated numerical value or quantity may be applicable unless otherwise specified, unless limited thereto in theory, or unless apparent from context.

5. The term "wafer" as used herein generally denotes a single-crystal silicon wafer wherein a semiconductor device (semiconductor integrated circuit device, electronic device, or the like) is formed. Further, the term "wafer" should be understood to include an epitaxial wafer, and a composite wafer, i.e., a combination of a semiconductor layer and an insulating substrate such as an SOI substrate or LCD glass substrate.

6. The term "power semiconductor device" as used herein indicates a semiconductor device that is capable of controlling at least a few watts of power. Hence, almost all the ordinary-type power MOSFETs are included in this category.

The term "trench-gate power MOSFET" indicates a kind of power MOSFET wherein a gate electrode made of polysilicon or the like is provided in a trench (relatively long, thin groove) formed in the device formation side (first principal surface side), and a channel is formed in the thickness (vertical) direction of a semiconductor substrate. In most cases of this configuration, a source region is provided in the device formation side of the semiconductor substrate, and a drain region is provided in the back surface side (second principal surface side). Note that a major portion of the gate electrode (a portion excluding an electrode lead-out portion) may be formed to protrude partially from the trench.

The term "double-gate-in-trench power MOSFET" indicates a kind of trench-gate power MOSFET wherein a field plate electrode is provided under a gate electrode (intrinsic gate electrode) in a trench. In most cases, the gate electrode (intrinsic gate electrode) and the field plate electrode (field plate gate electrode) are formed isolatedly in the trench because of fabrication process constraints (double-gate isolated-type structure). Contrastingly, in some cases, the gate electrode and the field plate electrode are formed integrally in the trench (double-gate integral-type structure). Both the double-gate isolated-type structure and the double-gate integral-type structure are regarded as belonging to the category of double-gate-in-trench power MOSFETs. Note that the double-gate isolated-type structure is further classified as a "gate-coupling type" or a "source-coupling type". In the gate-coupling type, a potential at the field plate gate electrode is equal to that at the intrinsic gate electrode (with coupling to the intrinsic gate electrode outside the trench), whereas in the source-coupling type, a potential at the field plate gate electrode is equal to that at the source electrode (with coupling to the source electrode outside the trench).

The term "field plate electrode" as used herein indicates an electrode that is arranged for dispersing a steep potential gradient concentrated in the vicinity of the drain-side end part of the gate electrode. In most cases, the field plate electrode is electrically coupled to the source electrode or the gate electrode. It is common practice to provide an interface between the field plate electrode and a drift region by forming an insulating film thicker than a gate insulating film (intrinsic gate insulating film).

The p-channel power MOSFET according to the present invention is used as a normally-off device in ordinary applications in consideration of fail-safe protection that is a basic requirement for power device operation. The threshold voltage (Vth) thereof has a negative value with respect to a source potential, and the Vth range to be handled in the present invention is approximately −0.5 volt to approximately −6 volts. A device having a threshold voltage (Vth) ranging from approximately −0.5 volt to approximately −1.5 volts is herein referred to as a "low-threshold-voltage device".

7. The term "linear", as used herein, is to be understood to signify a linear formation containing a curvature or bend as well as a straight-line formation.

In the description of such a component element as a trench or electrode, the wording "a multiplicity of" is used to denote a considerable degree of repetitive structural patterning that corresponds to "at least 10" in numerical terms. With regard to repetitive structural patterning of cell regions in the present invention, the wording "a multiplicity of" represents a numerical value ranging from 100 to 10,000 in common practice.

Details of the Preferred Embodiments

The following further describes the details of preferred embodiments of the present invention. Throughout the accompanying drawings, identical or like parts are designated by identical or like reference codes or numerals to avoid repetitive description thereof wherever appropriate for the sake of clarity.

Note also that, in some of the accompanying drawings, hatching or shading is not used for a cross-section where intricacy would be brought about on the contrary or where distinction from void spacing is apparent. In relation thereto, a background profile of a bottomed opening is not shown where apparent from the description concerned or context. Further, for the purpose of providing clear indication of non-void structures, hatching is applied to some of the areas that are not cross-sections.

1. Description of Double-Gate-in-Trench (Both n$^+$ Gates) P-Channel Power MOSFET Device Structure in First Preferred Embodiment With Primary Reference to FIGS. 1 to 5

In a case where a double-gate-in-trench p-channel power MOSFET is configured just by replacing the trench gate electrode and field plate electrode of a double-gate-in-trench n-channel power MOSFET with p-type polysilicon electrodes according to common design techniques, there may arise a disadvantageous condition that a threshold voltage tends to vary with time under the influence of boron from these p-type polysilicon electrodes. Hence; in a first preferred embodiment of the present invention, n-to-p type replacement is not made intentionally regarding the trench gate electrode and field plate electrode. While the trench gate electrode and field plate electrode are provided as individual elements in the first preferred embodiment, the trench gate electrode and field plate electrode may be formed integrally since the same type of polysilicon material is used for formation thereof.

Although various characteristic requirements and basic specifications are applicable to the design of the double-gate-in-trench p-channel power MOSFET, the following device specifications are assumed herein for the sake of convenience in explanation. Exemplary specifications . . . Drive voltage: approximately 4.5 volts, Vth: approximately −1.7 volts (in a range of approximately −0.5 to −6 volts), Withstand voltage: approximately 30 to 150 volts, Allowable current: approximately 80 to 160 amperes, Maximum operating frequency: approximately 10 to 150 kHz, Cell pitch: approximately 2.5 micrometers (in a range of approximately 0.8 to 4 micrometers), Gate width (dimension in patterning): approximately 0.35 micrometer (in a range of 0.15 to 0.6 micrometer), ON resistance: approximately 40 mΩ/mm$^2$, Chip size: approximately 3 mm in length by 5 mm in width (square or rectangular shape having each side dimension of the order of a few millimeters in common applications).

In the following description of examples (including examples in Section 2), a device arrangement for motor driving use is taken as a representative configuration. Hence, the trench gate electrode and the field plate electrode are electrically coupled to each other. Contrastingly, in a device arrangement for high-speed switching use (maximum operating frequency: approximately 150 kHz to 1 MHz), a gate capacitance can be reduced significantly by electrically coupling the source electrode and the field plate electrode to each other. Note, however, that it is required to provide a relatively thick insulating film between the trench gate electrode and the field plate electrode in the above case.

Figure 2:
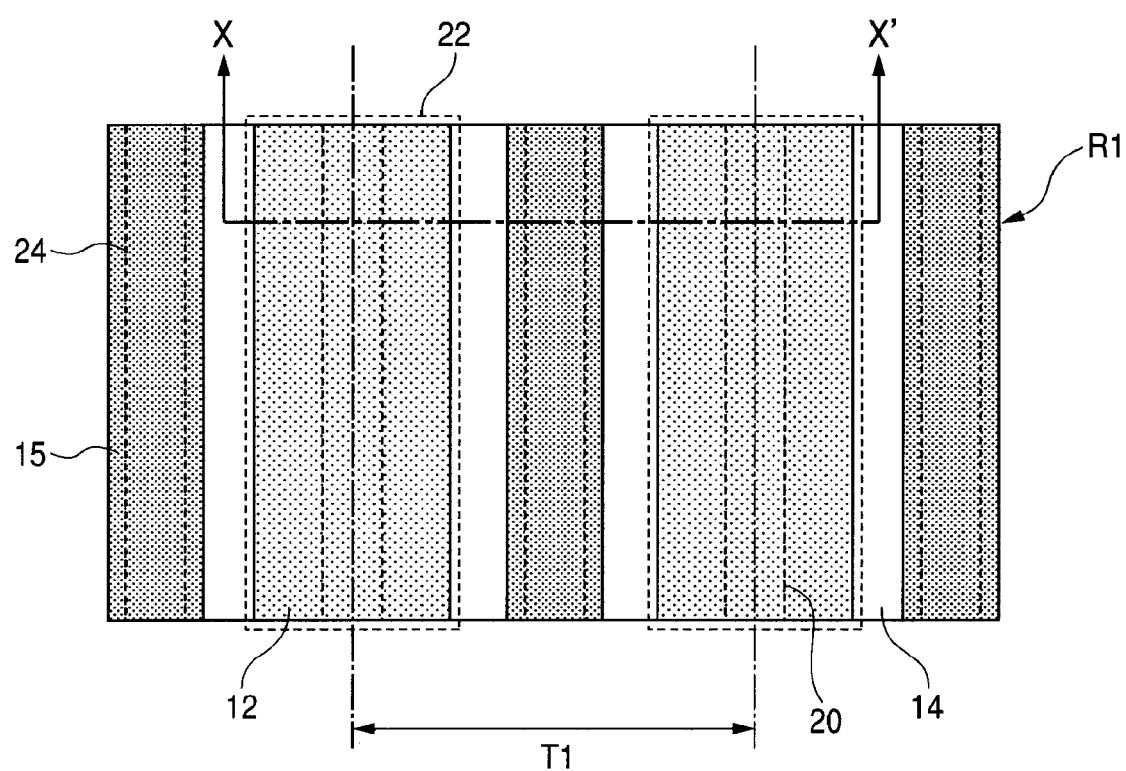
FIG. 2 is an enlarged top view of a cutout cell region R1 shown in FIG. 1.
Figure 3:
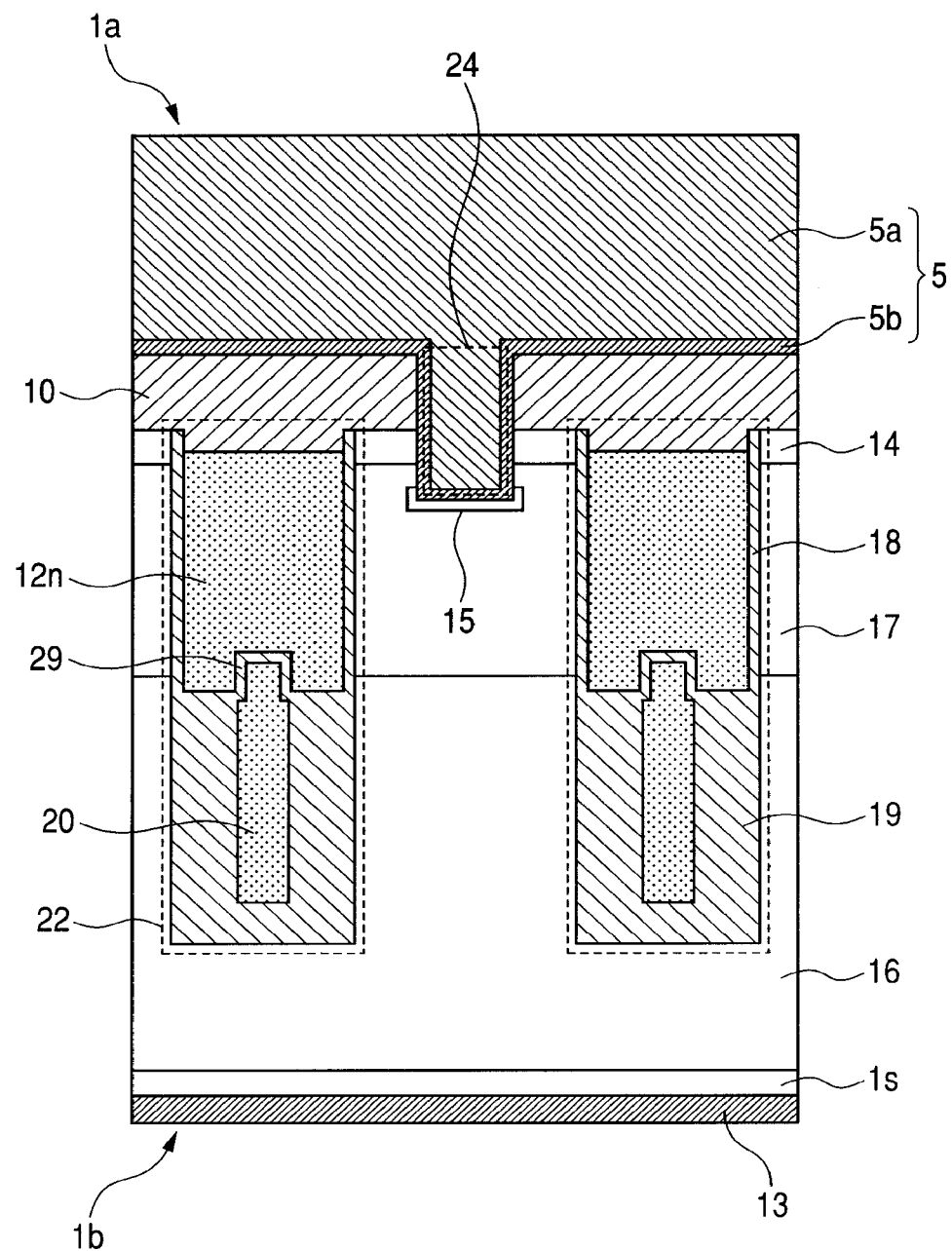
FIG. 3 is a device cross-sectional view taken along, line X-X' in FIG. 2 (according to the first preferred embodiment of the present invention)
Figure 4:
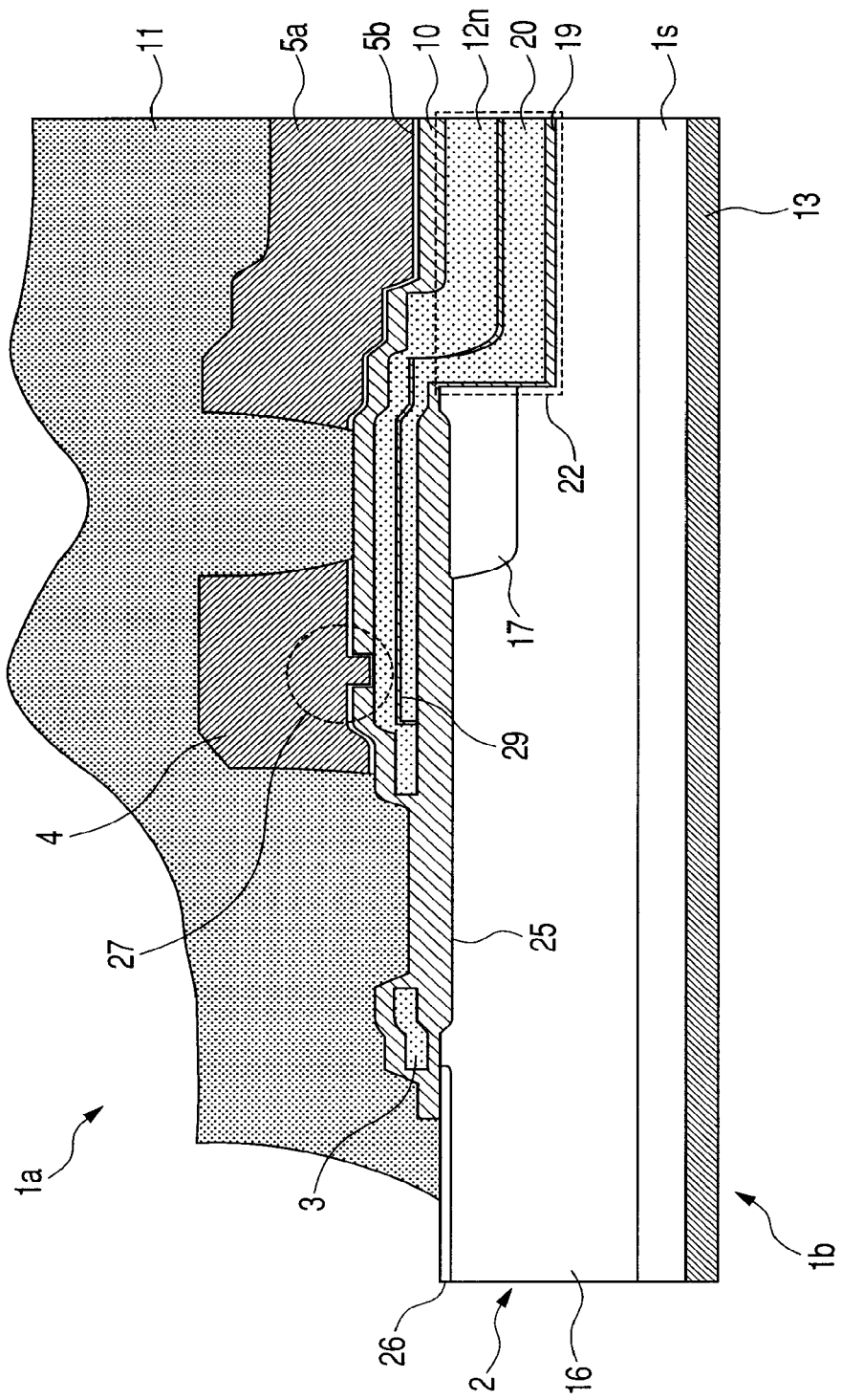
FIG. 4 is a device cross-sectional view taken along line Y'-Y in FIG. 1 (according to the first preferred embodiment of the present invention)
Figure 5:
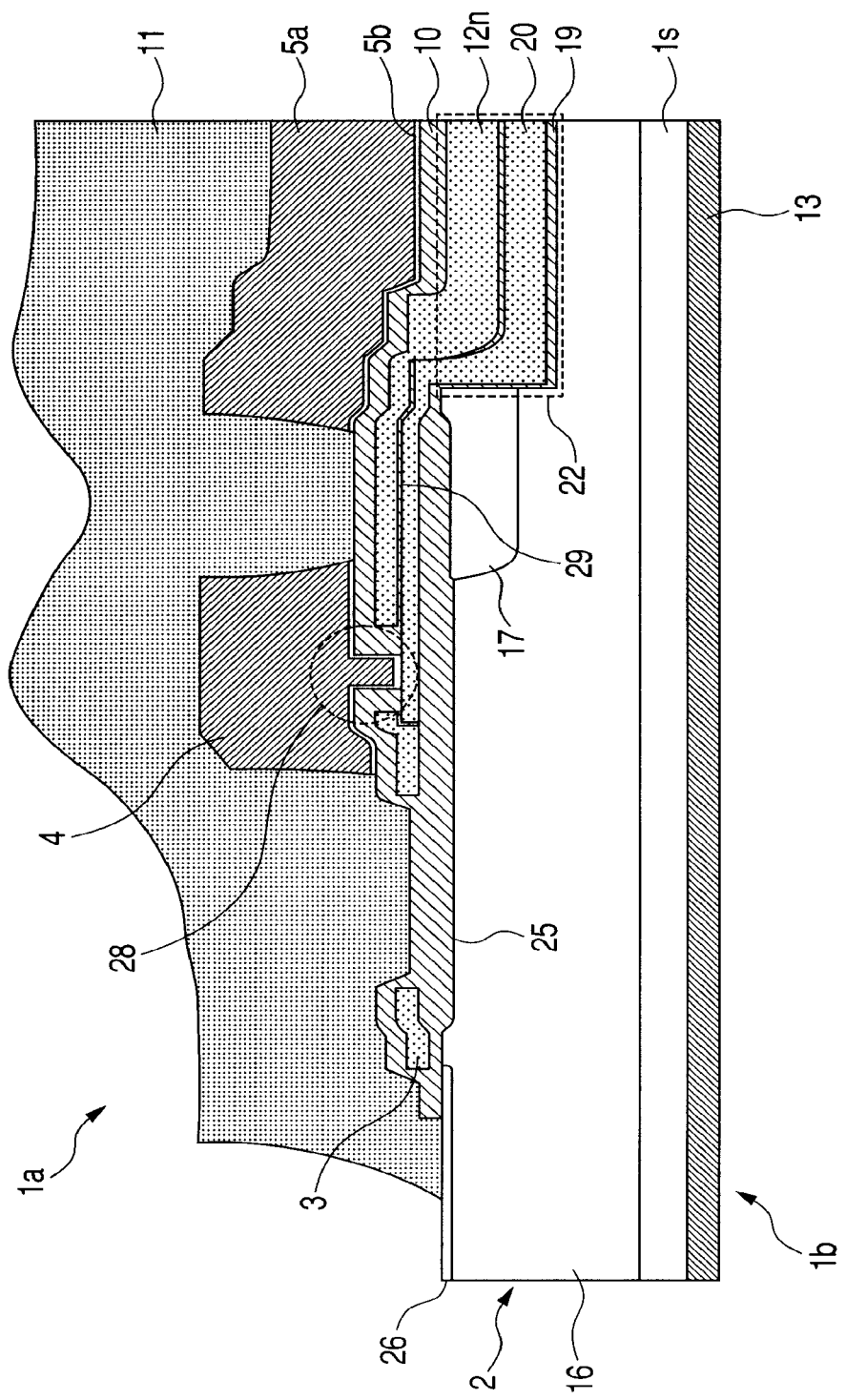
FIG. 5 is a device cross-sectional view taken along line Y"-Y in FIG. 1 (according to the first preferred embodiment of the present invention)

Referring to FIG. 1, there is shown a, chip top view of the double-gate-in-trench p-channel power MOSFET according to the first (second) preferred embodiment of the present invention. FIG. 2 is an enlarged top view of a cutout cell region R1 shown in FIG. 1. FIG. 3 shows a device cross-section taken along line X-X' in FIG. 2 (according to the first preferred embodiment), FIG. 4 shows a device cross-section taken along line Y'-Y in FIG. 1 (according to the first preferred embodiment), and FIG. 5 shows a device cross-section taken along line Y"-Y in FIG. 1 (according to the first preferred embodiment). With reference to these drawing figures, the following describes the structure of the double-gate-in-trench p-channel power MOSFET device according to the first preferred embodiment of the present invention.

First, with reference to FIG. 1 showing the double-gate-in trench p-channel power MOSFET, the structural outline of a top surface 1a of a device chip 2 is described below. As shown in FIG. 1, along a periphery of the chip 2 (e.g., silicon-based semiconductor substrate), there is disposed a polysilicon guard ring 3 that is an electrode having a ring-like circumferential arrangement. A ring-like electrode located inside the polysilicon guard ring 3 is a gate wiring line 4 used to provide outward leading for trench gate electrode extension. The gate wiring line 4 is coupled to a gate metal electrode 6. At a central area of the gate metal electrode 6, there is provided a gate pad opening 8 formed through a final passivation film 11 (polyimide film). Inside the gate wiring line 4, a source metal electrode 5 is disposed so as to occupy most of the chip top surface. Along an inner circumference of the source metal electrode 5, an outer periphery of a cell region 9 is located. At a central area of the source metal electrode 5, there is provided a source pad opening 7 formed through the final passivation film 11 (polyimide film). The cell region 9 has a repetitive structural pattern formed with identical periods. A partial region thereof, i.e., a cutout cell region R1 is shown as an enlarged top view in FIG. 2.

As shown in FIG. 2, the cell region 9 possesses a continuous translational symmetry characteristic (linear structural patterning) in the vertical direction and a repetitive translational symmetry characteristic (repetitive structural patterning) with cell region repeat periods T1 (gate pitch) in the horizontal direction. In a linear trench 22, a linear trench gate electrode 12 and a linear field plate electrode 20 are disposed. Along both sides of the linear trench gate electrode 12, a linear p$^+$ source region 14 is provided, and between two linear trench gate electrodes 12 disposed in a pair form, an n$^+$ body contact region 15 is provided. A linear contact groove 24 is formed along the center of the n$^+$ body contact region 15.

Then, with reference to FIG. 3 showing the cross-section taken along line X-X' in FIG. 2, the cross-sectional structure of the cell region 9 is described below. As shown in FIG. 3, in a back surface side 1b of a semiconductor substrate 1, there is provided a p$^+$ silicon single-crystal substrate region 1s. A back surface metal drain electrode 13 is disposed over the back surface side 1b of the semiconductor substrate 1 (this metal drain electrode is formed of a titanium layer, a nickel layer, and a gold layer, which are arranged in the order viewed from the vicinity of the semiconductor substrate 1, for example). In a substrate top surface side 1a with respect to the p$^+$ silicon single-crystal substrate region 1s, there is provided a p$^-$ drift region 16 (e.g., a silicon epitaxial region). Over the p$^-$ drift region 16, an n-type channel region 17 (n$^-$ well region) is provided. A p$^+$ source region 14 is provided over the n$^-$ well region 17 in the substrate top surface side 1a. The trench 22 is formed so as to extend from an upper position of the substrate top surface side 1a to the inside of the p$^-$ drift region 16 through the p$^+$ source region 14 and the n$^-$ well region 17. In each trench 22, the n$^+$ polysilicon field plate electrode 20 is disposed, and over the n$^+$ polysilicon field plate electrode 20, an n$^+$ trench gate electrode 12n is disposed via a field-plate/gate insulating film 29. The underside and both lateral sides of the n$^+$ polysilicon field plate electrode 20 are surrounded by a field plate periphery insulating film 19. Along both lateral sides of the n$^+$ trench gate electrode 12n, a gate insulating film 18 is formed. The upper side of the n$^+$ trench gate electrode 12n is capped with an interlayer insulating film 10. Through the interlayer insulating film 10 and the p$^+$ source region 14, the contact groove 24 is formed so as to extend to the n$^+$ body contact region 15 located inside the n-channel region 17. Along the inside of the contact groove 24 and the upper side of the interlayer insulating film 10, there is formed a barrier metal film 5b, e.g., a TiW film, and further, an aluminum-based source metal film 5a having a relatively large thickness is formed thereover.

Then, with reference to FIG. 4 showing the cross-section taken along line Y'-Y in FIG. 1 and also with reference to FIG. 5 showing the cross-reference taken along line Y"-Y in FIG. 1, the following describes outward leading of the n$^+$ trench gate electrode 12n and electrical coupling thereof with the n$^+$ polysilicon field plate electrode 20. As shown in FIG. 4, via the field-plate/gate insulating film 29, a cell lead-out part of the n$^+$ trench gate electrode 12n is formed over a cell lead-out part of the n$^+$ polysilicon field plate electrode 20, which extends over a field insulating film 25. Via a trench-gate-electrode/gate-wiring-line coupling part 27 (in the same layer as that of the source metal electrode), the cell lead-out part of the n$^+$ trench gate electrode 12n is coupled to the gate wiring line 4. On the other hand, as shown in FIG. 5, the cell lead-out part of the n$^+$ polysilicon field plate electrode 20 is coupled to the gate wiring line 4 via a field-plate/gate-wiring-line coupling part 28. Thus, through the gate wiring line 4, the n⁺ polysilicon field plate electrode 20 and the n⁺ trench gate electrode 12*n* are electrically coupled to each other in an indirect fashion.

Further, as shown in FIGS. 4 and 5, an outermost periphery p⁺ region 26 (formed in the same fabrication process as that for the source region) is provided along a principal surface edge part of the chip 2. Along the inside of the outermost periphery p⁺ region 26, the polysilicon guard ring 3 (second layer) is formed. The polysilicon guard ring 3 is electrically coupled to the outermost periphery p⁺ region 26 via a corner aluminum-based wiring line 30 (in the same layer as that of the gate wiring line). (Note that the outermost periphery p⁺ region 26 is arranged to have a potential level equal to a drain potential.) The inside area of the first principal surface side 1*a* of the chip 2 is covered with the final passivation film 11 (e.g., polyimide film).

2. Description of Double-Gate-in-Trench (p⁺ Intrinsic Gate) P-Channel Power MOSFET Device Structure in Second Preferred Embodiment With Primary Reference to FIGS. 1, 2, and 24 to 26

In a second preferred embodiment of the present invention, each n-type polysilicon trench gate electrode in the first preferred embodiment described in Section 1 is replaced with a p-type polysilicon trench gate electrode. Thus, the designing and fabrication of a low-threshold-voltage device or the like can be facilitated.

Figure 24:
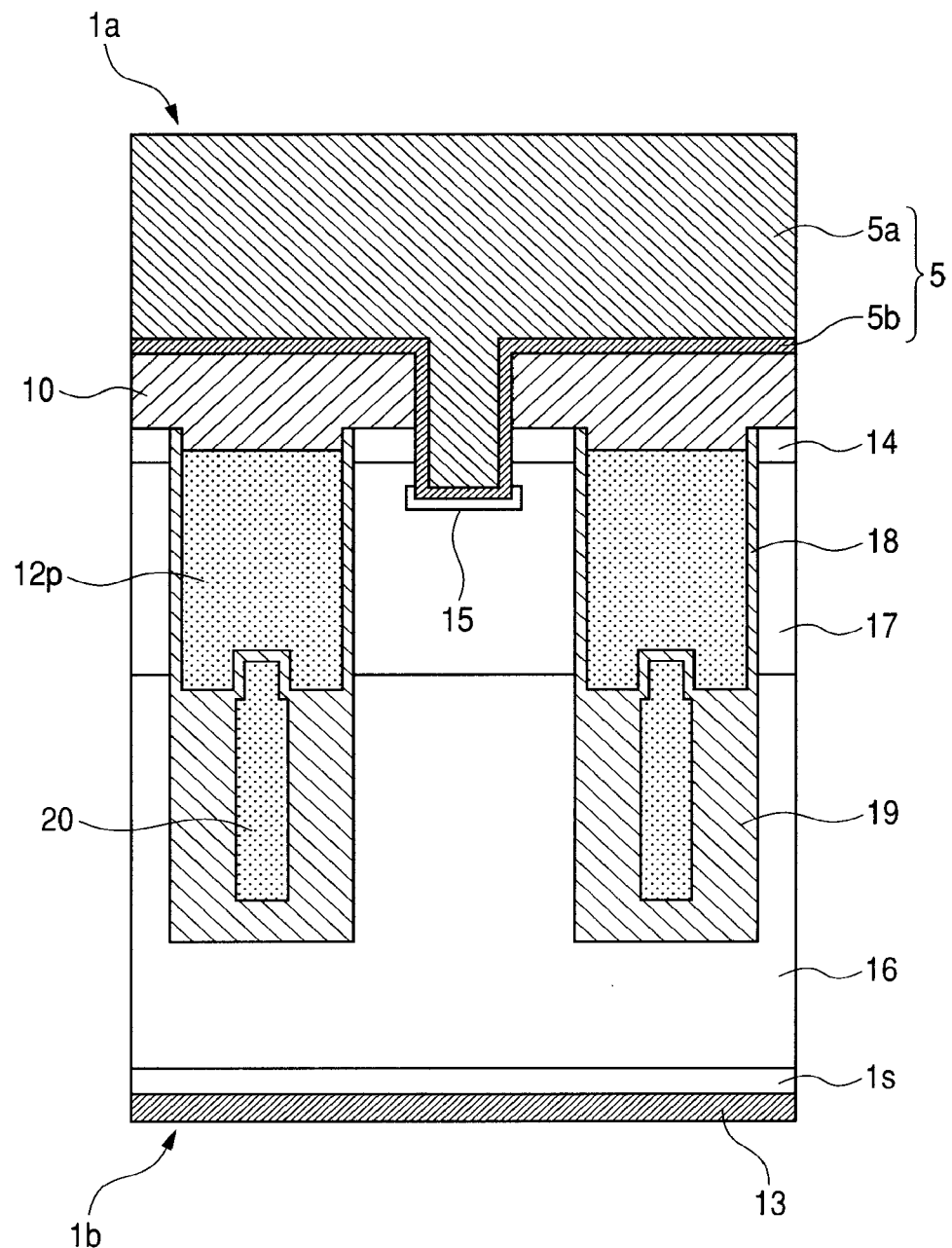
FIG. 24 is a device cross-sectional view taken along line X-X' in FIG. 2 (according to the second preferred embodiment of the present invention)
Figure 25:
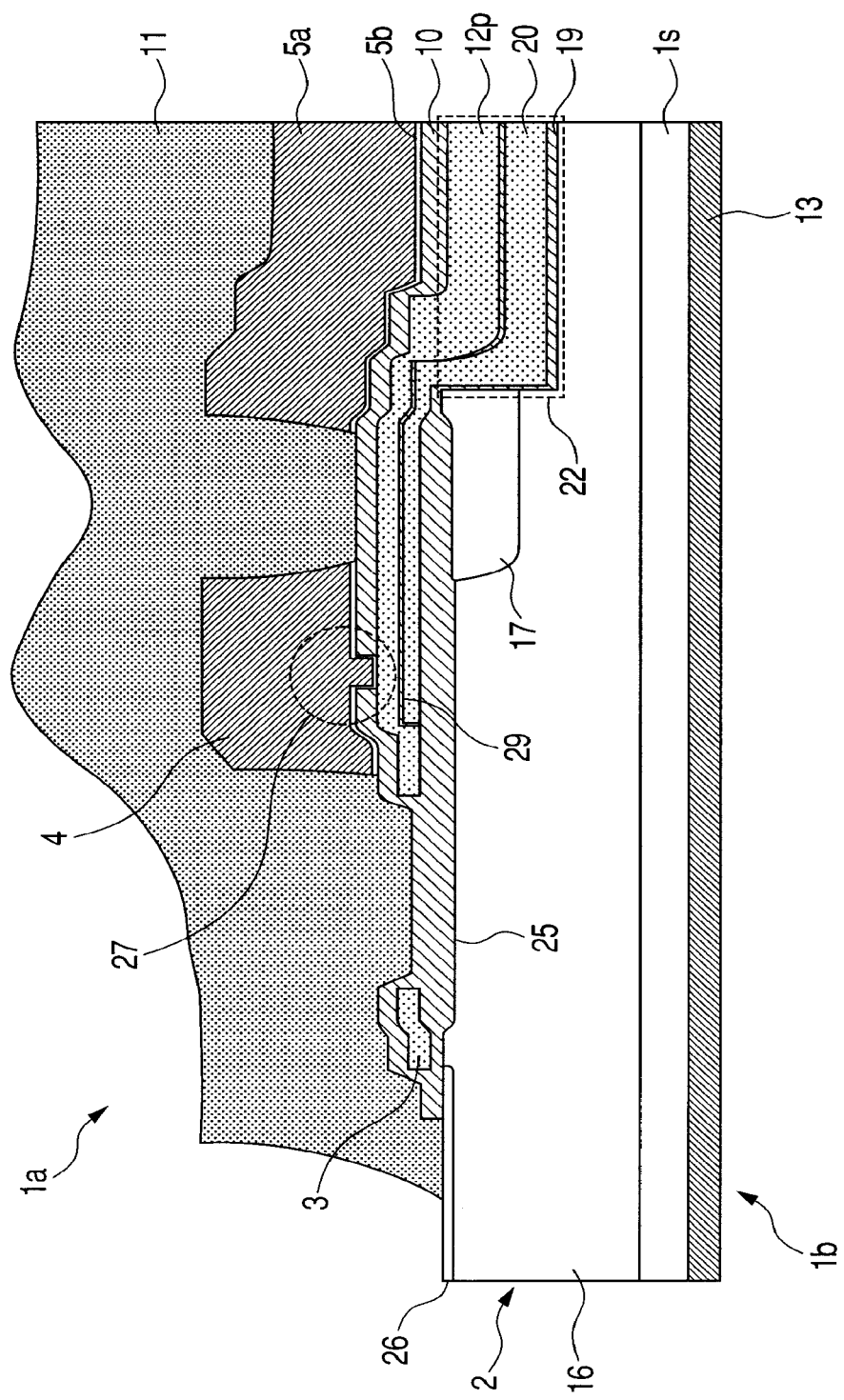
FIG. 25 is a device cross-sectional view taken along line Y'-Y in FIG. 1 (according to the second preferred embodiment of the present invention)
Figure 26:
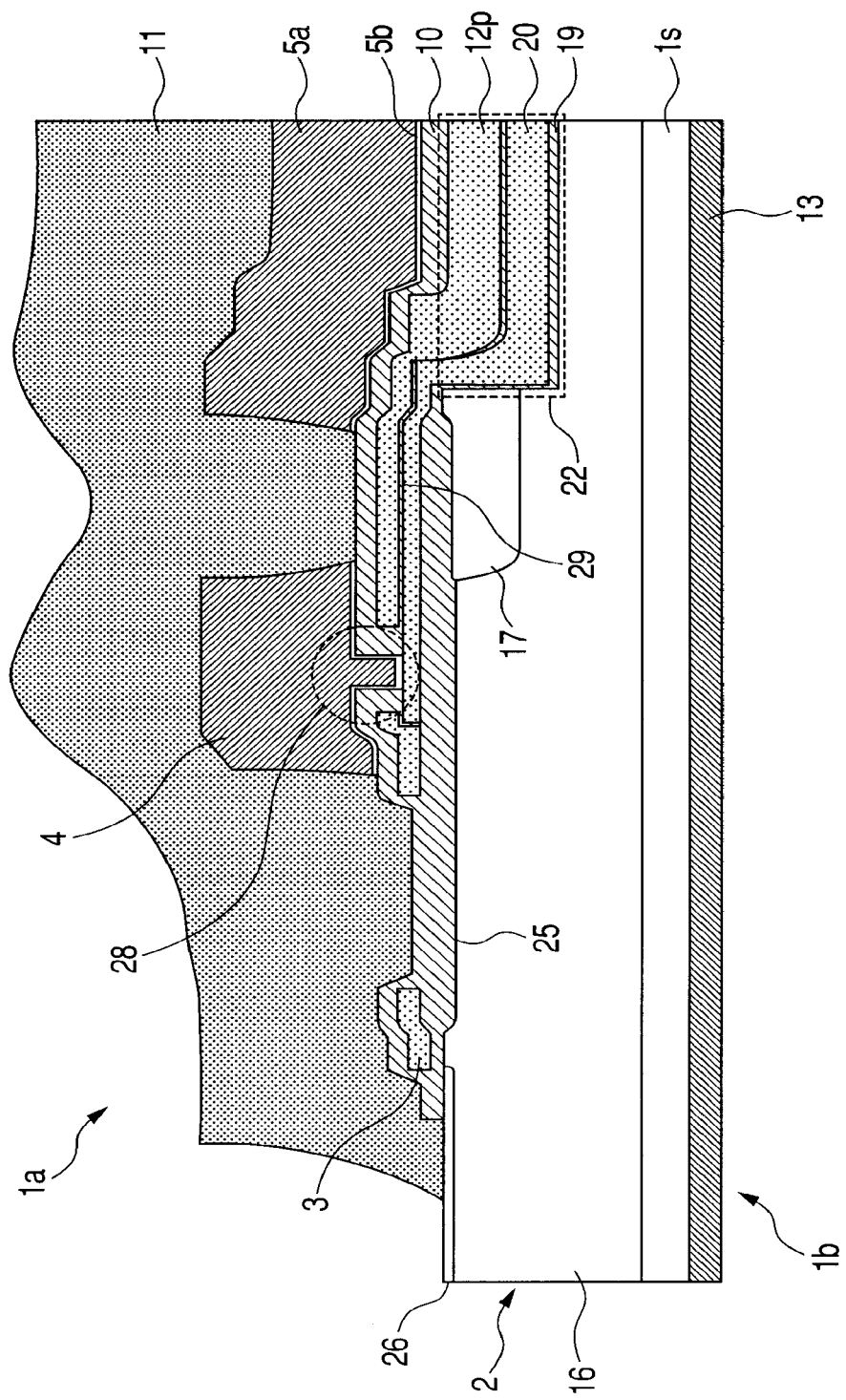
FIG. 26 is a device cross-sectional view taken along line Y"-Y in FIG. 1 (according to the second preferred embodiment of the present invention)

Since the descriptions regarding FIGS. 1 and 2 given in Section 1 are also applicable to the second preferred embodiment of the present invention, this section describes the second preferred embodiment primarily as related to FIGS. 24 to 26.

FIG. 24 shows a device cross-section taken along line X-X' in FIG. 2 (according to the second preferred embodiment), FIG. 25 shows a device cross-section taken along line Y'-Y in FIG. 1 (according to the second preferred embodiment), and FIG. 26 shows a device cross-section taken along line Y"-Y in FIG. 1 (according to the second preferred embodiment). With reference to these drawing figures, the following describes the structure of the double-gate-in-trench p-channel power MOSFET device according to the second preferred embodiment of the present invention.

With reference to FIG. 24 showing the cross-section taken along line X-X' in FIG. 2 explained in Section 1, the cross-sectional structure of the cell region 9 is described below. As shown in FIG. 24, in the back surface side 1*b* of the semiconductor substrate 1, the p⁺ silicon single-crystal substrate region 1*s* is provided. The back surface metal drain electrode 13 is disposed over the back surface side 1*b* of the semiconductor substrate 1 (this metal drain electrode is formed of a titanium layer, a nickel layer, and a gold layer, which are arranged in the order viewed from the vicinity of the semiconductor substrate 1, for example). In the substrate top surface side 1*a* with respect to the p⁺ silicon single-crystal substrate region 1*s*, the p⁻ drift region 16 is provided (e.g., a silicon epitaxial region). Over the p⁻ drift region 16, the n-type channel region 17 (n⁻ well region) is provided. The p⁺ source region 14 is provided over the n⁻ well region 17 in the substrate top surface side 1*a*. The trench 22 is formed so as to extend from an upper position of the substrate top surface side 1*a* to the inside of the p⁻ drift region 16 through the p⁺ source region 14 and the n⁻ well region 17. In each trench 22, the n⁺ polysilicon field plate electrode 20 is disposed, and over the polysilicon field plate electrode 20, a p⁺ trench gate electrode 12*p* is disposed via the field-plate/gate insulating film 29. The underside and both lateral sides of the n⁺ polysilicon field plate electrode 20 are surrounded by the field plate periphery insulating film 19. Along both lateral sides of the p⁺ trench gate electrode 12*p*, the gate insulating film 18 is formed. The upper side of the p⁺ trench gate electrode 12*p* is capped with the interlayer insulating film 10. Through the interlayer insulating film 10 and the p⁻ source region 14, the contact groove 24 is formed so as to extend to the n⁺ body contact region 15 located inside the n-channel region 17. Along the inside the contact groove 24 and the upper side of the interlayer insulating film 10, the barrier metal film 5*b*, e.g., a TiW film, is formed. Further, the aluminum-based source metal film 5*a* having a relatively large thickness is formed thereover.

Then, with reference to FIG. 25 showing the cross-section taken along line Y'-Y in FIG. 1 and also with reference to FIG. 26 showing the cross-section taken along line Y"-Y in FIG. 1, the following describes outward leading of the p⁺ trench gate electrode 12*p* and electrical coupling thereof with the n⁺ polysilicon field plate electrode 20. As shown in FIG. 25, via the field-plate/gate insulating film 29, a cell lead-out part of the p⁺ trench gate electrode 12*p* is formed over a cell lead-out part of the n⁺ polysilicon field plate electrode 20, which extends over the field insulating film 25. Via the trench-gate-electrode/gate-wiring-line coupling part 27 (in the same layer as that of the source metal electrode), the cell lead-out part of the p⁺ trench gate electrode 12*p* is coupled to the gate wiring line 4. On the other hand, as shown in FIG. 26, the cell lead-out part of the n⁺ polysilicon field plate electrode 20 is coupled to the gate wiring line 4 via the field-plate/gate-wiring-line coupling part 28. Thus, through the gate wiring line 4, the n⁺ polysilicon field plate electrode 20 and the p⁺ trench gate electrode 12*p* are electrically coupled to each other in an indirect fashion.

Further, as shown in FIGS. 25 and 26, the outermost periphery p⁺ region 26 (formed in the same fabrication process as that for the source region) is provided along the principal surface edge part of the chip 2. Along the inside of the outermost periphery p⁺ region 26, the polysilicon guard ring 3 (second layer) is formed. The polysilicon guard ring 3 is electrically coupled to the outermost periphery p⁺ region 26. The inside area of the first principal surface side 1*a* of the chip 2 is covered with the final passivation film 11 (e.g., polyimide film).

3. Description of Major Wafer Processes for Fabrication of Double-Gate-in-Trench P-Channel Power MOSFET in First and Second Preferred Embodiments With Primary Reference to FIGS. 6 to 23

The device fabrication process flow is basically common to the first and second preferred embodiments of the present invention, except that there is a partial difference in polysilicon gate electrode processing therebetween. Then, the following describes the device fabrication flow according to the first preferred embodiment, with the inclusion of additional description of particularities in the second preferred embodiment.

Figure 6:
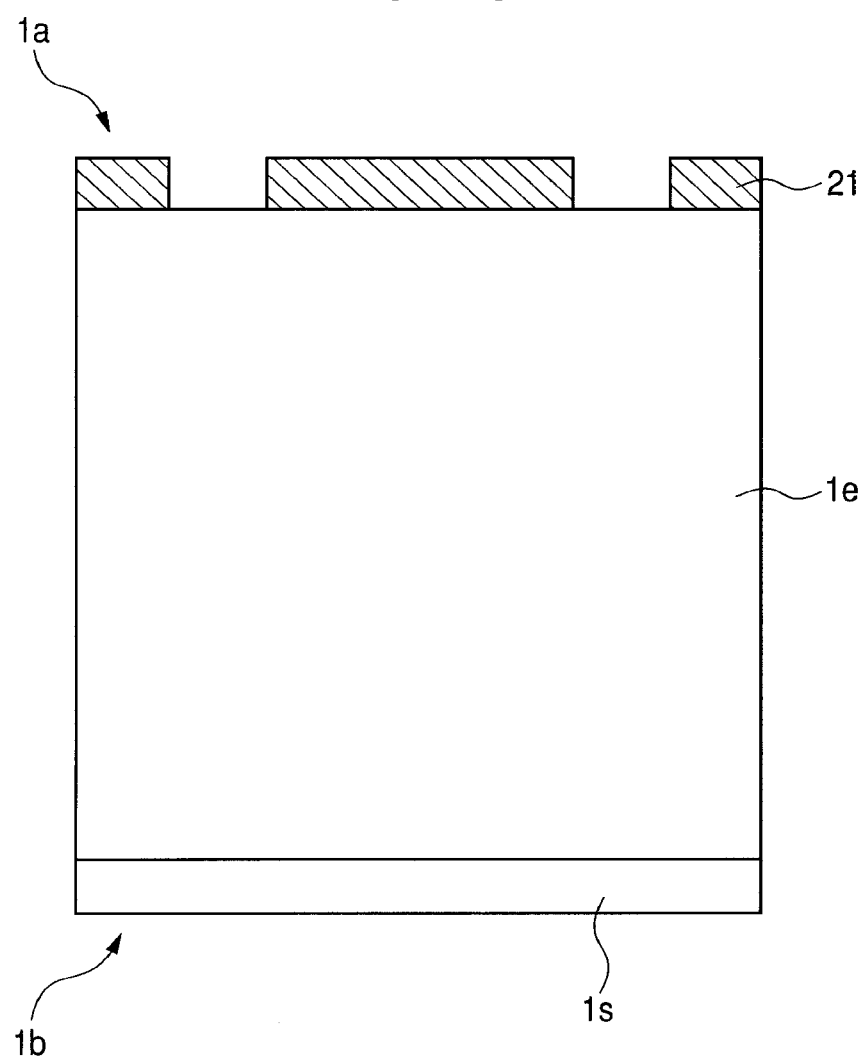
FIG. 6 is a process flow diagram corresponding to the device cross-section taken long line X-X' of FIG. 2 in the double-gate-in-trench p-channel power MOSFET according to the first and second preferred embodiments of the present invention (hard mask film patterning process for trench fabrication)
Figure 7:
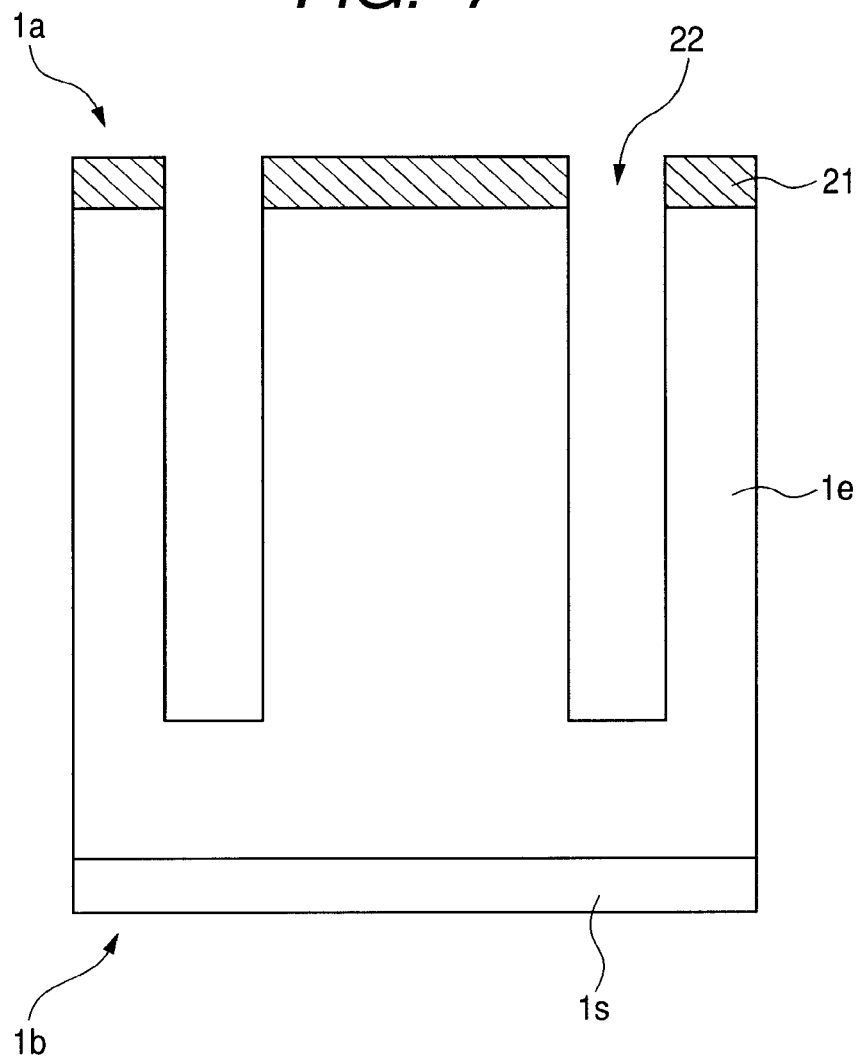
FIG. 7 is a process flow diagram corresponding to the device cross-section taken along line X-X' of FIG. 2 in the double-gate-in-trench p-channel power MOSFET according to the first and second preferred embodiments of the present invention (trench fabrication process)
Figure 8:
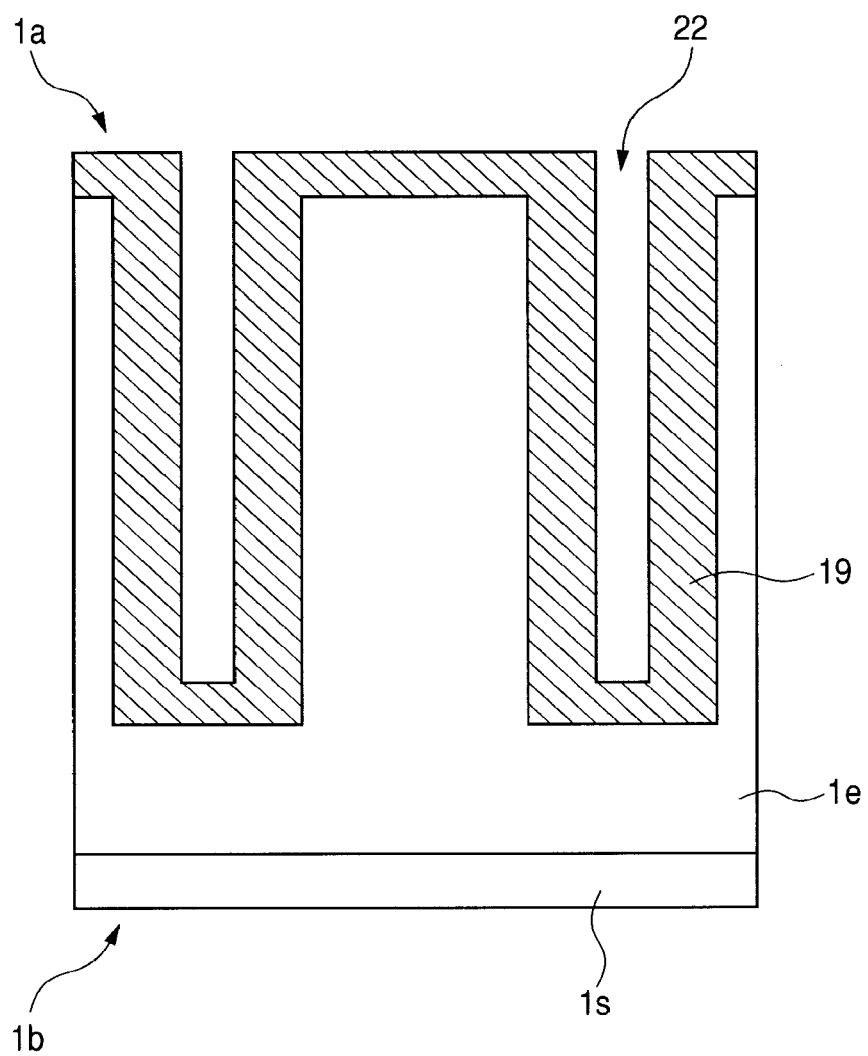
FIG. 8 is a process flow diagram corresponding to the device cross-section taken along line X-X' of FIG. 2 in the double-gate-in-trench p-channel power MOSFET according to the first and second preferred embodiments of the present invention (field plate periphery insulating film formation process)
Figure 9:
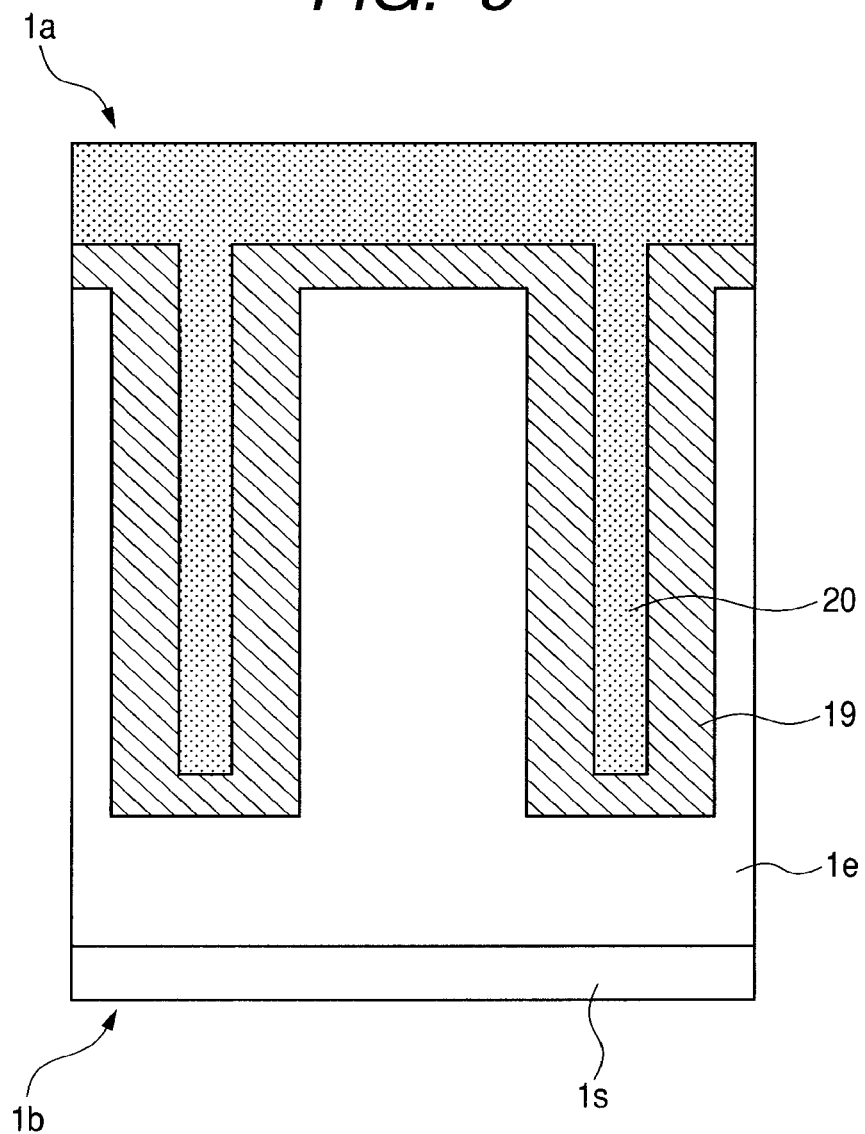
FIG. 9 is a process flow diagram corresponding to the device cross-section taken along line X-X' of FIG. 2 in the double-gate-in-trench p-channel power MOSFET according to the first and second preferred embodiments of the present invention (field plate electrode polysilicon film formation process)
Figure 10:
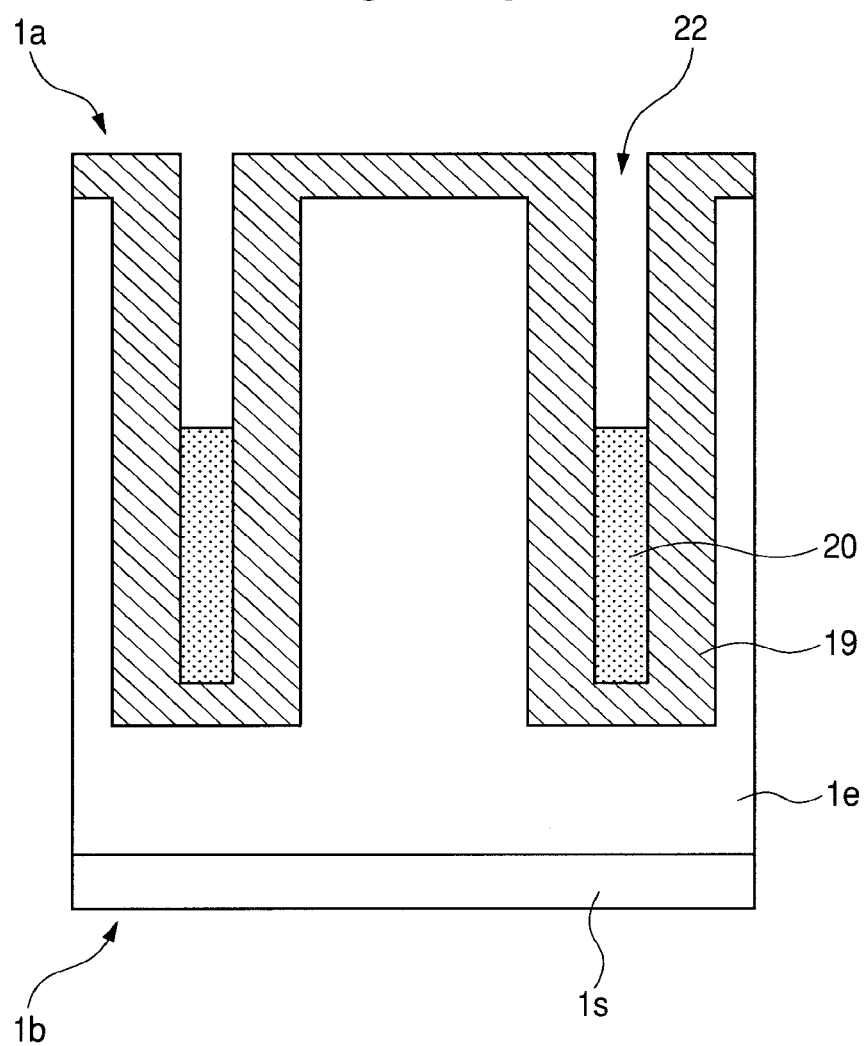
FIG. 10 is a process flow diagram corresponding to the device cross-section taken along line X-X' of FIG. 2 in the double-gate-in-trench p-channel power MOSFET according to the first and second preferred embodiments of the present invention (field plate fabrication process)
Figure 11:
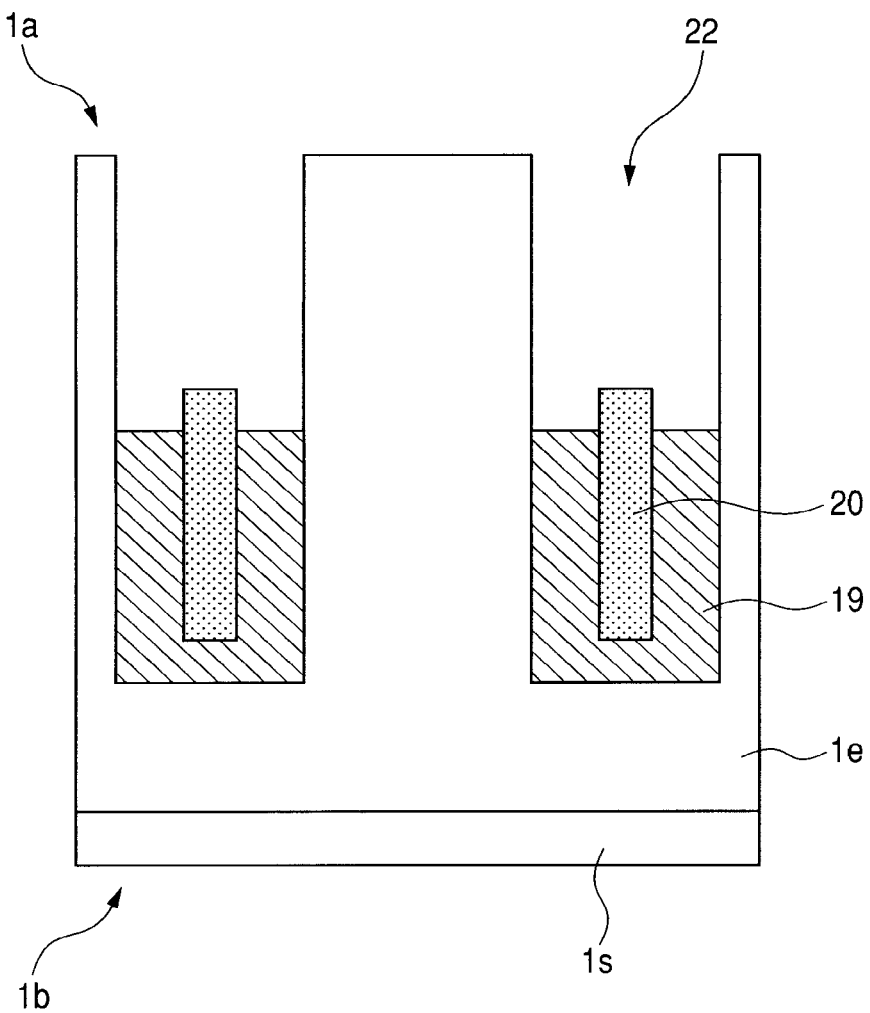
FIG. 11 is a process flow diagram corresponding to the device cross-section taken along line X-X' of FIG. 2 in the double-gate-in-trench p-channel power MOSFET according to the first and second preferred embodiments of the present invention (field plate periphery insulating film etch-back process)
Figure 12:
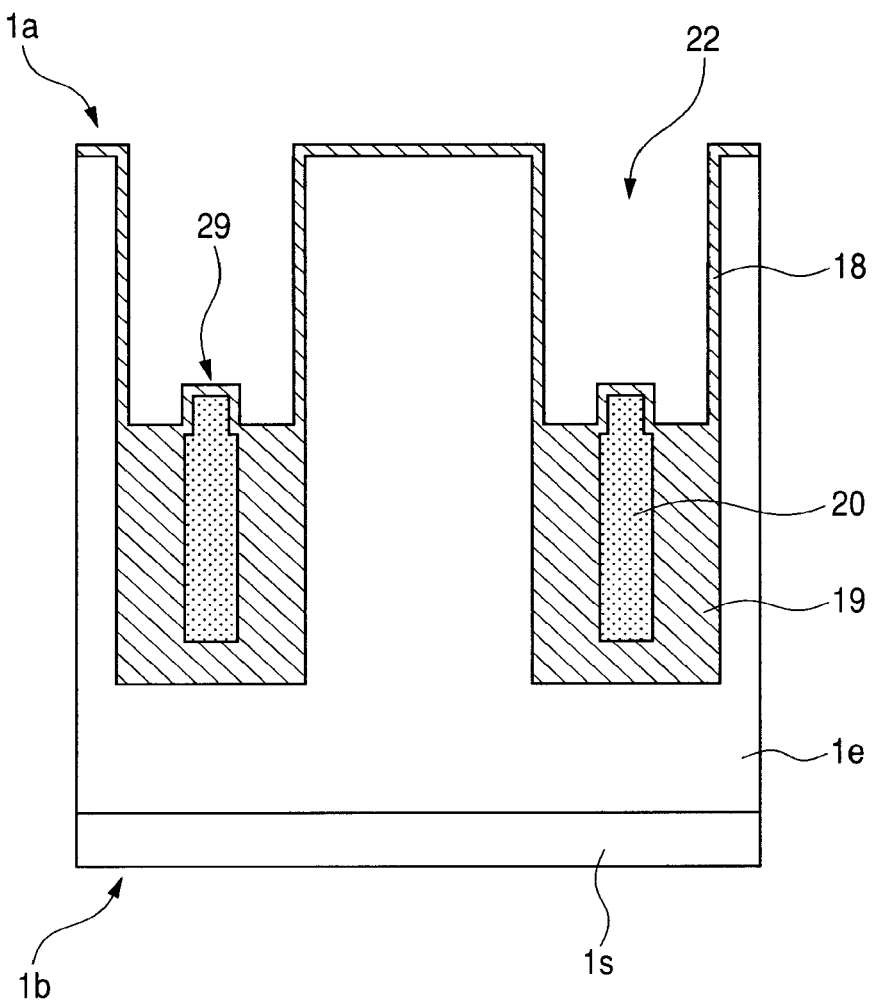
FIG. 12 is a process flow diagram corresponding to the device cross-section taken along line X-X' of FIG. 2 in the double-gate-in-trench p-channel power MOSFET according to the first and second preferred embodiments of the present invention (gate insulating film formation process)
Figure 13:
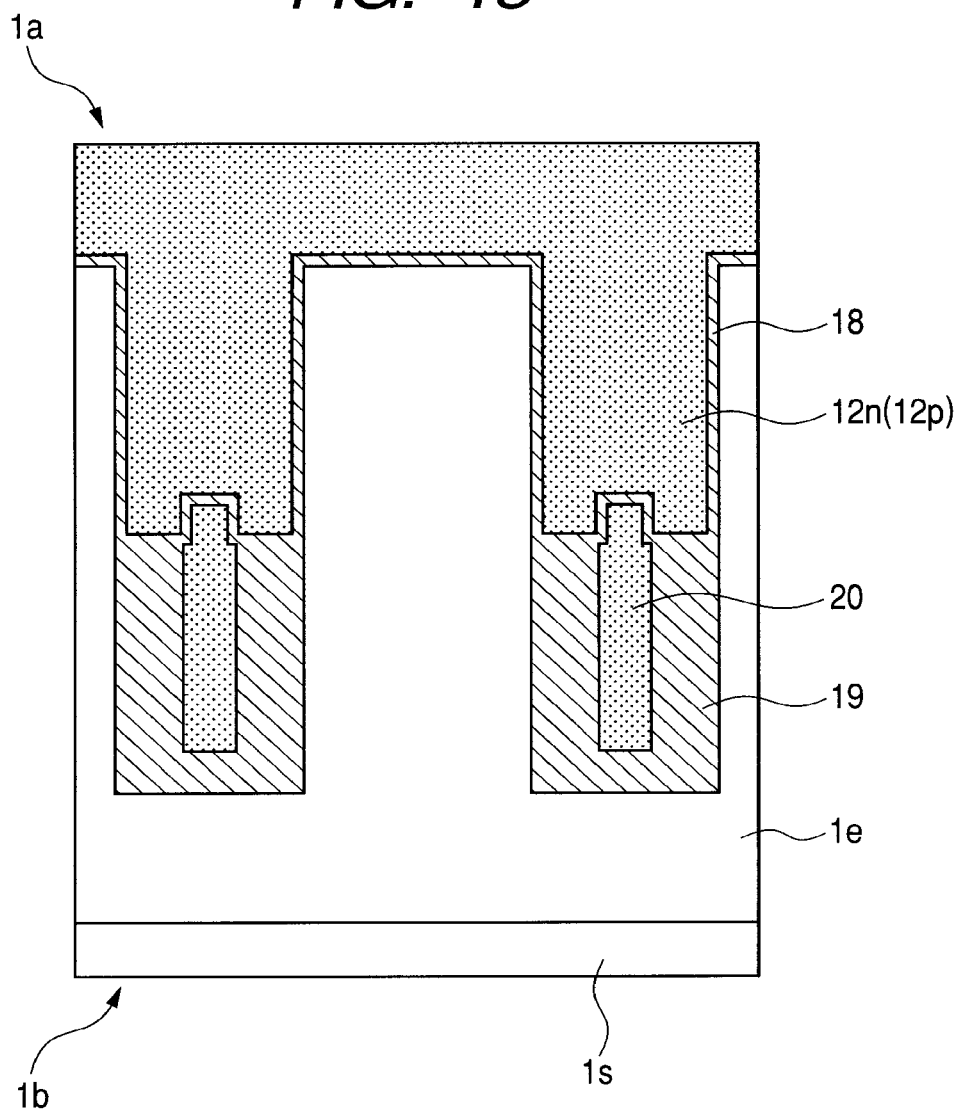
FIG. 13 is a process flow diagram corresponding to the device cross-section taken along line X-X' of FIG. 2 in the double-gate-in-trench p-channel power MOSFET according to the first and second preferred embodiments of the present invention (gate electrode polysilicon film formation process)
Figure 14:
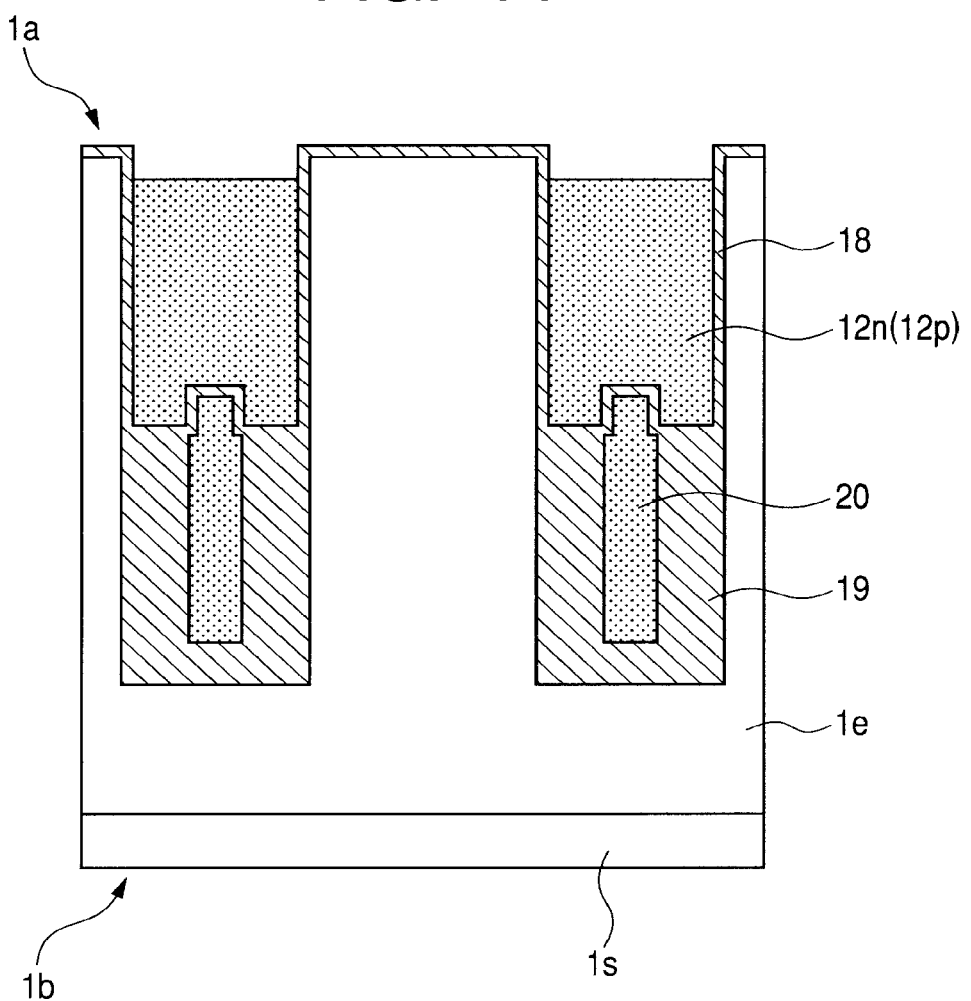
FIG. 14 is a process flow diagram corresponding to the device cross-section taken along line X-X' of FIG. 2 in the double-gate-in-trench p-channel power MOSFET according to the first and second preferred embodiments of the present invention (gate electrode patterning process)
Figure 15:
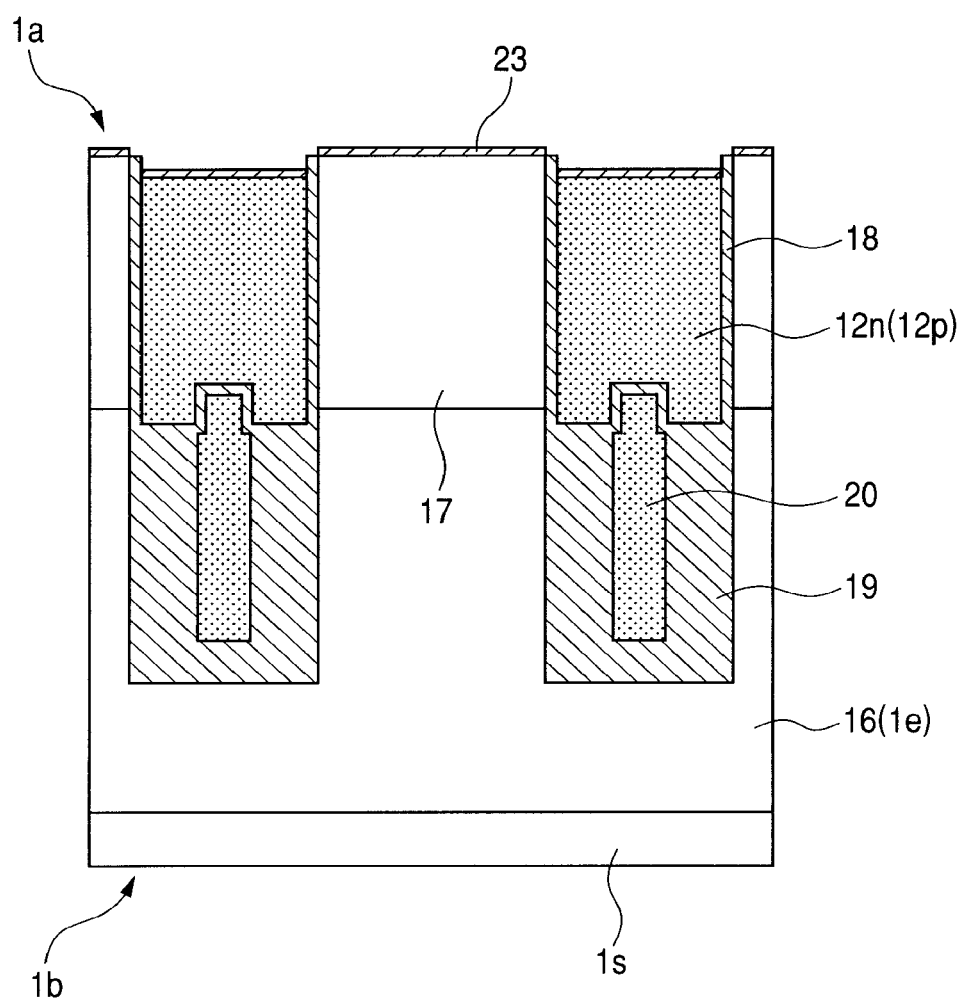
FIG. 15 is a process flow diagram corresponding to the device cross-section taken along line X-X' of FIG. 2 in the double-gate-in-trench p-channel power MOSFET according to the first and second preferred embodiments of the present invention (n-channel region formation process)
Figure 16:
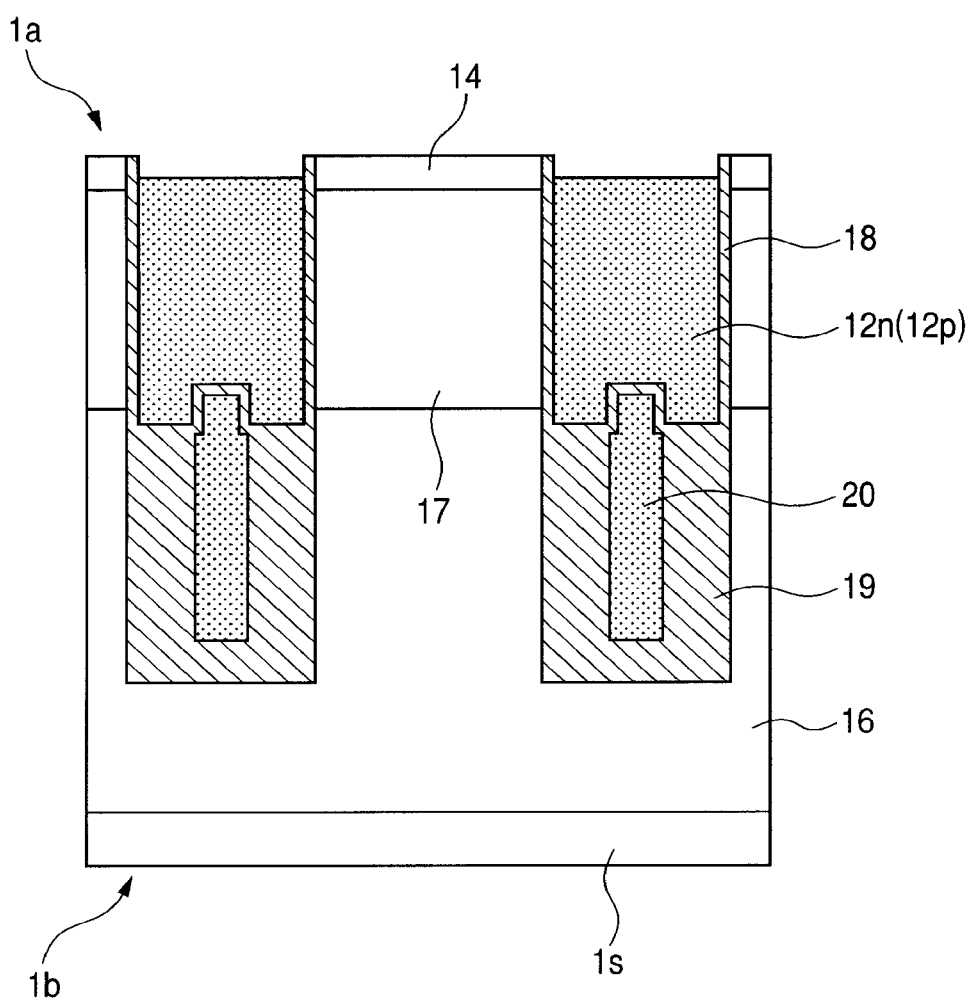
FIG. 16 is a process flow diagram corresponding to the device cross-section taken along line X-X' of FIG. 2 in the double-gate-in-trench p-channel power MOSFET according to the first and second preferred embodiments of the present invention ($p^+$ source region formation process)
Figure 17:
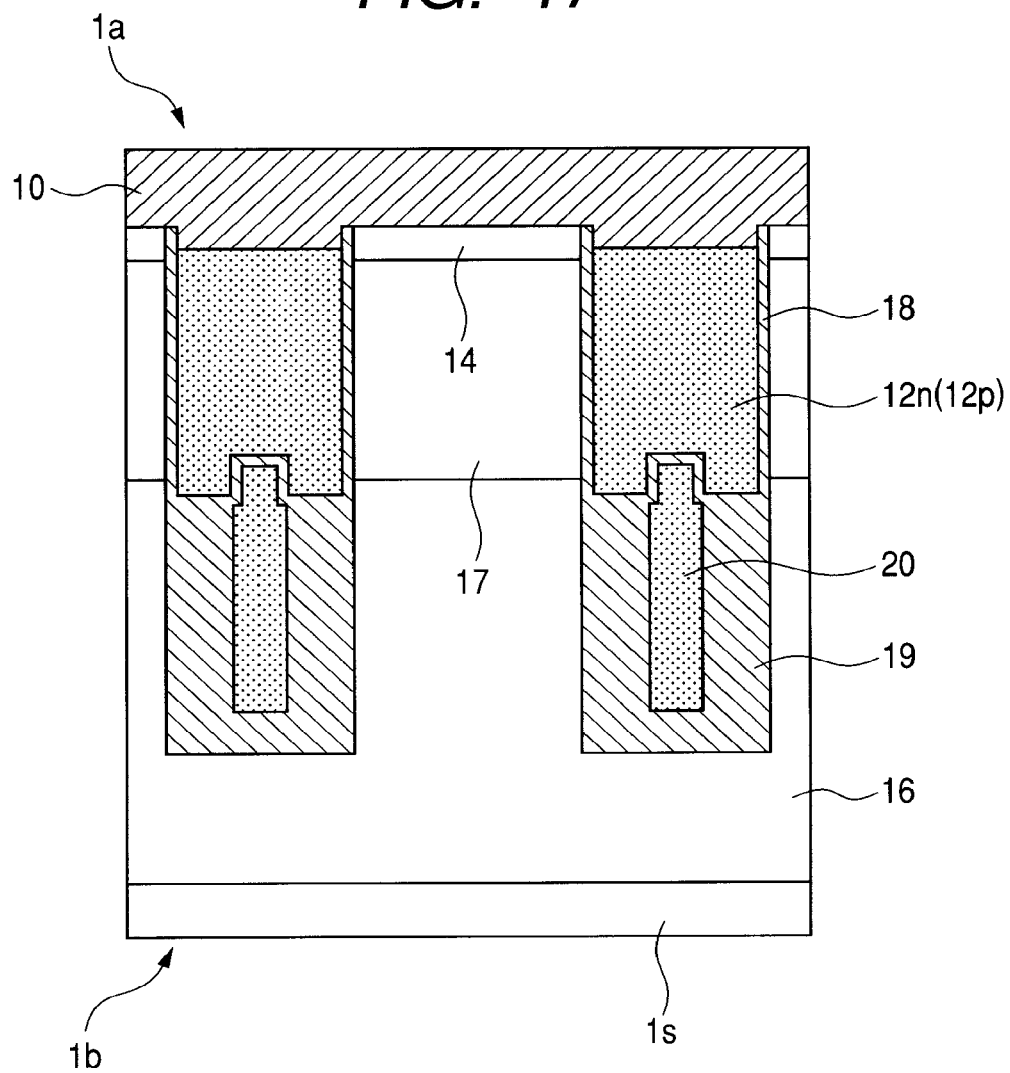
FIG. 17 is a process flow diagram corresponding to the device cross-section taken along line X-X' of FIG. 2 in the double-gate-in-trench p-channel power MOSFET according to the first and second preferred embodiments of the present invention (interlayer insulating film formation process)
Figure 18:
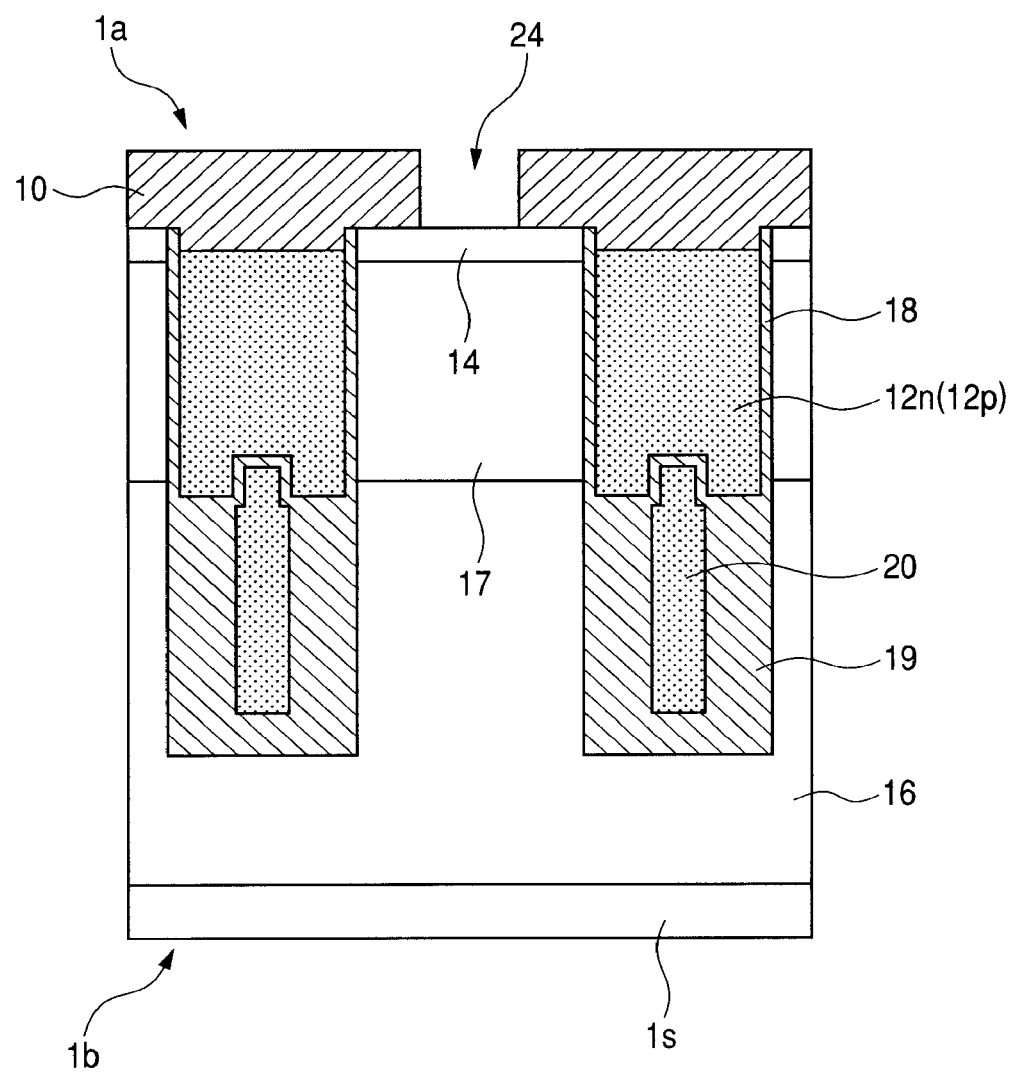
FIG. 18 is a process flow diagram corresponding to the device cross-section taken along line X-X' of FIG. 2 in the double-gate-in-trench p-channel power MOSFET according to the first and second preferred embodiments of the present invention (contact hole formation process)
Figure 19:
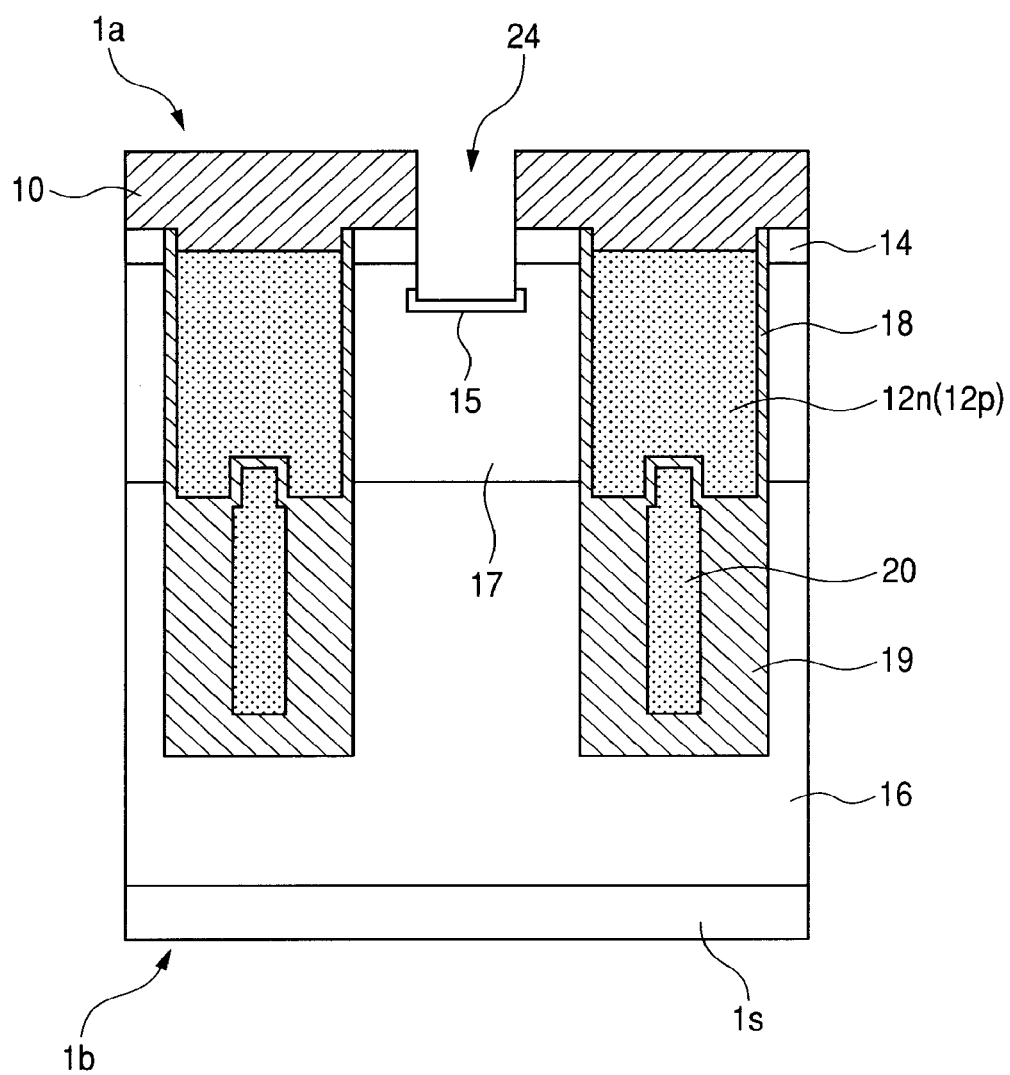
FIG. 19 is a process flow diagram corresponding to the device cross-section taken along line X-X' of FIG. 2 in the double-gate-in-trench p-channel power MOSFET according to the first and second preferred embodiments of the present invention (contact hole extension and $n^+$ body contact region formation process)
Figure 20:
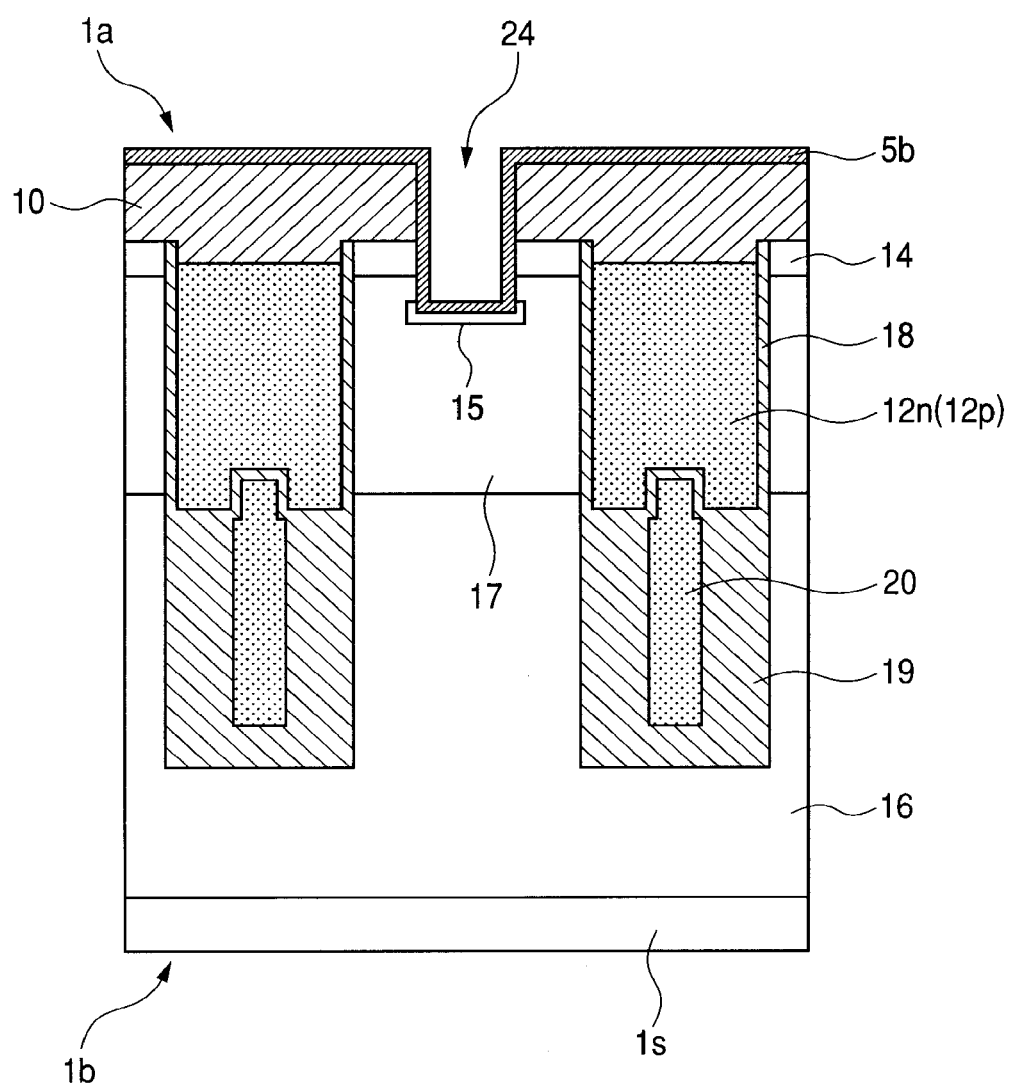
FIG. 20 is a process flow diagram corresponding to the device cross-section taken along line X-X' of FIG. 2 in the double-gate-in-trench p-channel power MOSFET according to the first and second preferred embodiments of the present invention (barrier metal film formation process)
Figure 21:
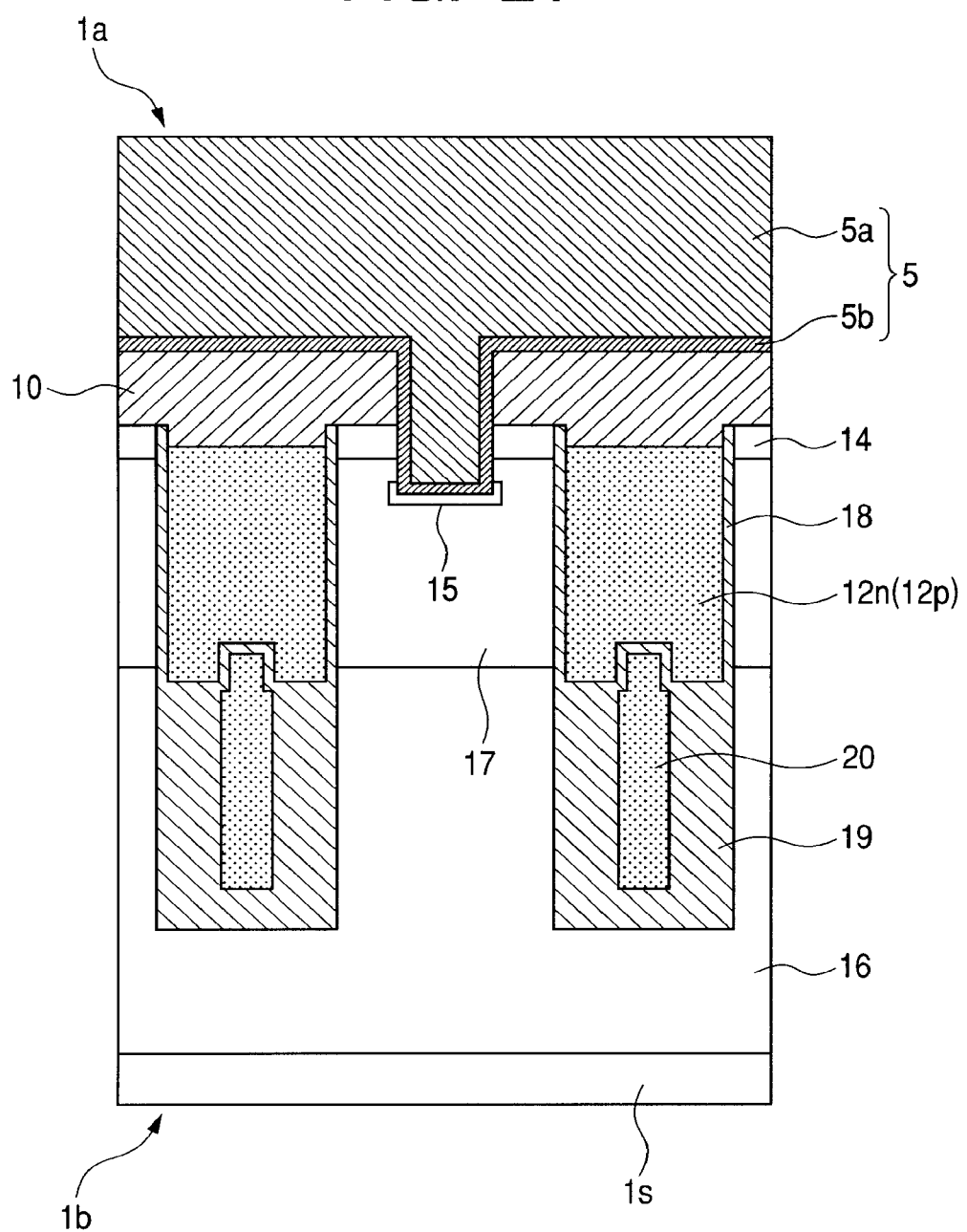
FIG. 21 is a process flow diagram corresponding to the device cross-section taken along line X-X' of FIG. 2 in the double-gate-in-trench p-channel power MOSFET according to the first and second preferred embodiments of the present invention (aluminum-based source metal electrode formation process)
Figure 22:
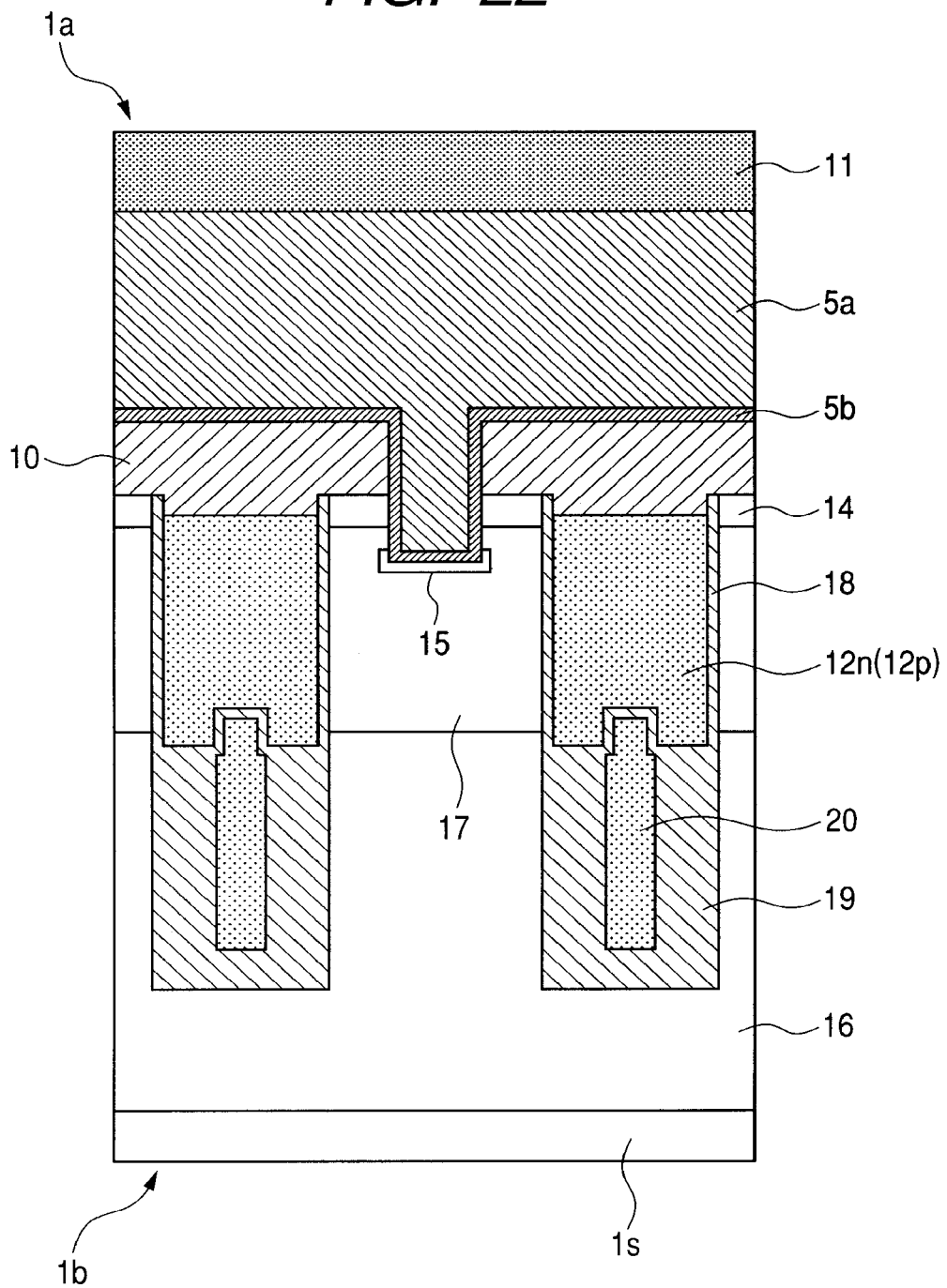
FIG. 22 is a process flow diagram corresponding to the device cross-section taken along line X-X' of FIG. 2 in the double-gate-in-trench p-channel power MOSFET according to the first and second preferred embodiments of the present invention (polyimide-based final passivation film formation process)
Figure 23:
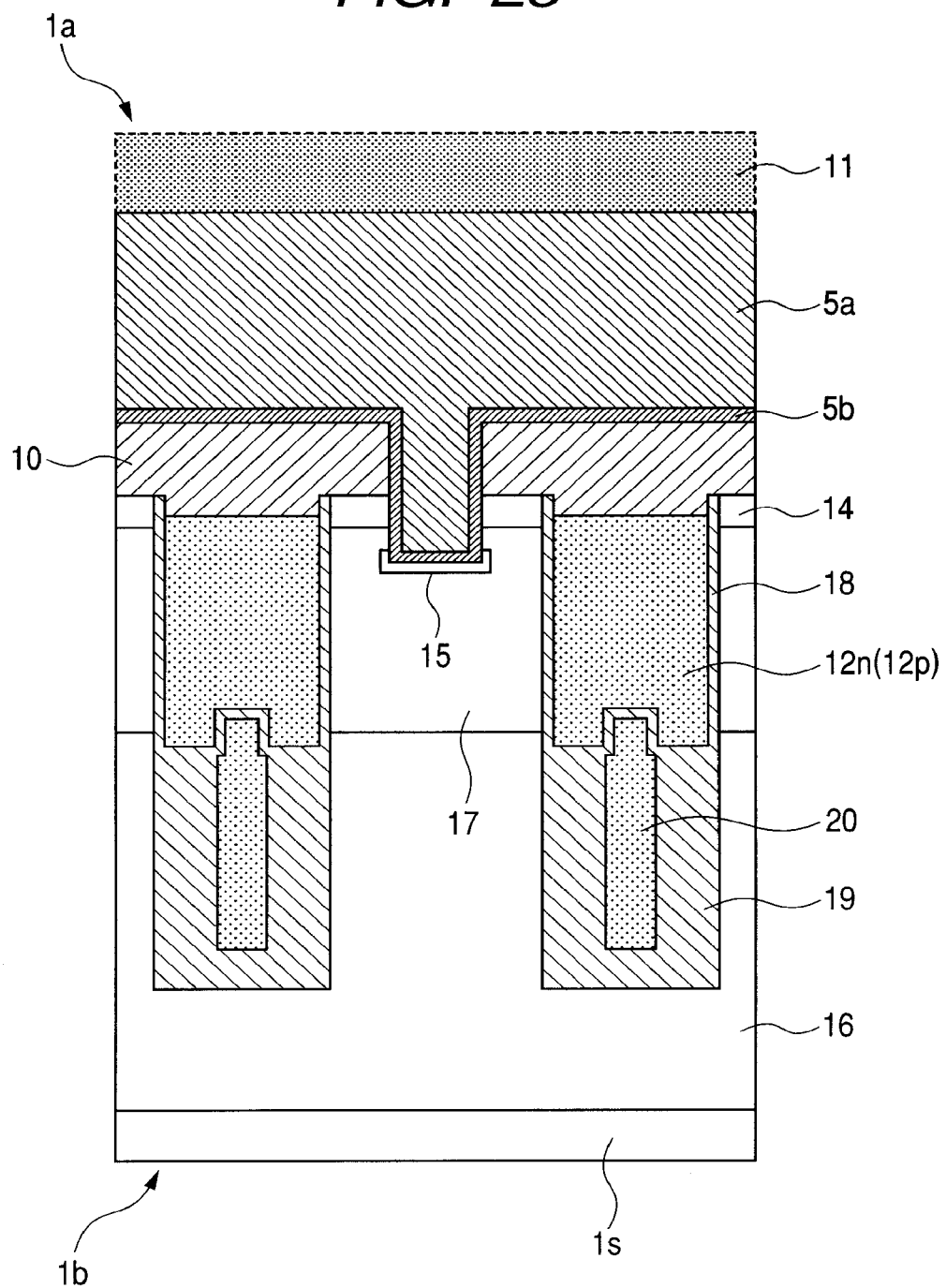
FIG. 23 is a process flow diagram corresponding to the device cross-section taken along line X-X' of FIG. 2 in the double-gate-in-trench p-channel power MOSFET according to the first and second preferred embodiments of the present invention (gate pad opening and source pad opening formation process)

Referring to FIG. 6, there is shown a process flow diagram corresponding to the device cross-section taken along line X-X' of FIG. 2 in the double-gate-in-trench p-channel power MOSFET according to the first and second preferred embodiments of the present invention (hard mask film patterning process for trench fabrication). FIG. 7 shows a process flow diagram corresponding to the device cross-section taken along line X-X' of FIG. 2 in the double-gate-in-trench p-channel power MOSFET according to the first and second preferred embodiments (trench fabrication process). FIG. 8 shows a process flow diagram corresponding to the device cross-section taken along line X-X' of FIG. 2 in the double-gate-in-trench p-channel power MOSFET according to the first and second preferred embodiments (field plate periphery insulating film formation process). FIG. 9 shows a process flow diagram corresponding to the device cross-section taken along line X-X' of FIG. 2 in the double-gate-in-trench p-channel power MOSFET according to the first and second preferred embodiments (field plate electrode polysilicon film formation process). FIG. 10 shows a process flow diagram corresponding to the device cross-section taken along line X-X' of FIG. 2 in the double-gate-in-trench p-channel power MOSFET according to the first and second preferred embodiments (field plate fabrication process). FIG. 11 shows a process flow diagram corresponding to the device cross-section taken along line X-X' of FIG. 2 in the double-gate-in-trench p-channel power MOSFET according to the first and second preferred embodiments (field plate periphery insulating film etch-back process). FIG. 12 shows a process flow diagram corresponding to the device cross-section taken along line X-X' of FIG. 2 in the double-gate-in-trench p-channel power MOSFET according to the first and second preferred embodiments (gate insulating film formation process). FIG. 13 shows a process flow diagram corresponding to the device cross-section taken along line X-X' of FIG. 2 in the double-gate-in-trench p-channel power MOSFET according to the first and second preferred embodiments (gate electrode polysilicon film formation process). FIG. 14 shows a process flow diagram corresponding to the device cross-section taken along line X-X' of FIG. 2 in the double-gate-in-trench p-channel power MOSFET according to the first and second preferred embodiments (gate electrode patterning process). FIG. 15 shows a process flow diagram corresponding to the device cross-section taken along line X-X' of FIG. 2 in the double-gate-in-trench p-channel power MOSFET according to the first and second preferred embodiments (n-channel region formation process). FIG. 16 shows a process flow diagram corresponding to the device cross-section taken along line X-X' of FIG. 2 in the double-gate-in-trench p-channel power MOSFET according to the first and second preferred embodiments ($p^+$ source region formation process). FIG. 17 shows a process flow diagram corresponding to the device cross-section taken along line X-X' of FIG. 2 in the double-gate-in-trench p-channel power MOSFET according to the first and second preferred embodiments (interlayer insulating film formation process). FIG. 18 shows a process flow diagram corresponding to the device cross-section taken along line X-X' of FIG. 2 in the double-gate-in-trench p-channel power MOSFET according to the first and second preferred embodiments (contact hole formation process). FIG. 19 shows a process flow diagram corresponding to the device cross-section taken along line X-X' of FIG. 2 in the double-gate-in-trench p-channel power MOSFET according to the first and second preferred embodiments (contact hole extension and $n^+$ body contact region formation process). FIG. 20 shows a process flow diagram corresponding to the device cross-section taken along line X-X' of FIG. 2 in the double-gate-in-trench p-channel power MOSFET according to the first and second preferred embodiments (barrier metal film formation process). FIG. 21 shows a process flow diagram corresponding to the device cross-section taken along line X-X' of FIG. 2 in the double-gate-in-trench p-channel power MOSFET according to the first and second preferred embodiments (aluminum-based source metal electrode formation process). FIG. 22 shows a process flow diagram corresponding to the device cross-section taken along line X-X' of FIG. 2 in the double-gate-in-trench p-channel power MOSFET according to the first and second preferred embodiments (polyimide-based final passivation film formation process). FIG. 23 shows a process flow diagram corresponding to the device cross-section taken along line X-X' of FIG. 2 in the double-gate-in-trench p-channel power MOSFET according to the first and second preferred embodiments (gate pad opening and source pad opening formation process). With reference to these drawing figures, the following describes the major processes for fabrication of the double-gate-in-trench p-channel power MOSFET according to the first and second preferred embodiments of the present invention.

In the description given below, it is exemplified that, as a starting material wafer, there is used a $p^-$ epitaxial wafer 1 prepared by forming a $p^-$ epitaxial layer 1e (epitaxial layer thickness: approximately 7 micrometers in the case of withstand voltage requirement of approximately 40 volts) over a 200ø $p^+$ silicon single-crystal wafer 1s (silicon-based wafer). Note that the wafer diameter may be 300ø, 400ø, or any other value. If necessary, any semiconductor wafer or substrate other than a silicon-based wafer may be used with the exception of an n-type epitaxial wafer.

First, as shown in FIG. 6 for example, a silicon oxide film 21 having a thickness of approximately 450 nm is formed over almost the entire area of a device formation surface 1a of a wafer 1 by low-pressure chemical vapor deposition (CVD) or the like. Then, a hard mask film 21 for trench fabrication is formed by patterning the thus formed silicon oxide film 21 through ordinary lithography.

Thereafter, as shown in FIG. 7 for example, a trench 22 having a depth of approximately 3 micrometers is formed by anisotropic dry etching through use of the hard mask film 21 for trench fabrication.

Then, as shown in FIG. 8 for example, by thermal oxidation, a silicon oxide film (having a thickness of approximately 200 nm) corresponding to the field plate periphery insulating film 19 is formed over the inside surface of the trench 22 and the device formation surface 1a of the wafer 1.

Then, as shown in FIG. 9 for example, by CVD or the like, a high-concentration phosphorus-doped polysilicon layer (first-layer polysilicon film) having a thickness of approximately 600 nm corresponding to the field plate electrode 20 is formed in the inside portion of the trench 22 and over almost the entire area of the device formation surface 1a of the wafer 1.

Then, as shown in FIG. 10 for example, by dry etching with an etching gas such as $SF_6$, the high-concentration phosphorus-doped polysilicon layer 20 is etched back to the extent of approximately 1.4 micrometers from the principal silicon surface.

Then, as shown in FIG. 11 for example, by wet etching with a silicon oxide etching solution such as a hydrofluoric acid solution, the field plate periphery insulating film 19 is partially removed to such an extent that the Si side wall of the trench is exposed halfway.

Then, as shown in FIG. 12 for example, a gate insulating film 18 (silicon oxide film) having a thickness of approximately 50 nm is formed by thermal oxidation or the like. At this process step, a field-plate/gate insulating film 29 is formed also.

Then, as shown in FIG. 13 for example, by CVD or the like, a high-concentration phosphorus-doped polysilicon layer (second-layer polysilicon film) having a thickness of approximately 600 nm corresponding to the trench gate electrode 12n (trench gate polysilicon layer) is formed in the inside portion of the trench 22 and over almost the entire area of the device formation surface 1a of the wafer 1.

At this process step, in the case of the second preferred embodiment, a high-concentration boron-doped polysilicon layer 12p is formed in lieu of the high-concentration phosphorus-doped polysilicon layer 12n.

Then, as shown in FIG. 14 for example, by dry etching with an etching gas such as $SF_6$, the high-concentration phosphorus-doped polysilicon layer 12n is etched back so that the principal silicon surface is exposed.

Then, as shown in FIG. 15 for example, by thermal oxidation or the like, the device formation surface 1a of the wafer 1 is covered with a silicon oxide film 23 for channel dopant implantation. Then, in the entire area of the cell region 9, phosphorus ion implantation is carried out to form an n-type channel region 17 (n⁻ well region). For this ion implantation, the following conditions are applicable, i.e., Ion species: phosphorus, Implant energy: approximately 200 keV to 400 keV, Concentration: approximately $1\times10^{12}/cm^2$ to $5\times10^{13}/cm^2$. On completion of the ion implantation, the silicon oxide film 23 formed through thermal oxidation is removed.

Then, as shown in FIG. 16 for example, in the entire area of the cell region 9, p-type dopant ion implantation is carried out to form a p⁺ source region 14. For this ion implantation, the following conditions are applicable, e.g., Ion species: $BF_2$, Implant energy: approximately 50 keV to 100 keV, Concentration: approximately $1\times10^{15}/cm^2$ to $5\times10^{15}/cm^2$.

Then, as shown in FIG. 17 for example, an interlayer insulating film 10 is formed over almost the entire area of the device formation surface 1a of the wafer 2. As the interlayer insulating film 10, a phospho-silicate glass (PSG) film having a thickness of approximately 450 nm is formed preferably.

Then, as shown in FIG. 18 for example, by ordinary lithography, an etching-resist mask pattern (resist film) is formed over the device formation surface 1a of the wafer 1. Through use of this mask pattern, anisotropic dry etching is carried out to form a contact hole 24 (contact groove).

Then, as shown in FIG. 19 for example, by anisotropic dry etching, the contact groove 24 is extended to a position deeper than the p⁺ source region 14. Thereafter, n-type dopant ions are implanted into the bottom portion of the thus extended contact groove 24 to form an n⁺ body contact region 15 in a self-alignment fashion. For this ion implantation, the following conditions are applicable, e.g., Ion species: phosphorus, Implant energy: approximately 80 keV, Concentration: approximately $1\times10^{15}/cm^2$ to $5\times10^{15}/cm^2$.

Then, as shown in FIG. 20 for example, by sputtering film formation, a barrier metal film 5b such as a TiW film having a thickness of approximately 200 nm is formed over the inside surface of the contact groove 24 and over almost the entire area of the device formation surface 1a of the wafer 1. (By thermal processing to be performed later, most of the titanium content in the TiW film is forced to migrate to the silicon interface to form silicide, contributing to enhancement in contact characteristic. The processes concerned are not shown in the accompanying drawings to avoid complexity in illustration.)

Then, as shown in FIG. 21 for example, by sputtering film formation, an aluminum-based source metal film 5a having a thickness of approximately 5 micrometers (main aluminum content with silicon additive on the order of a few percent) is formed in the inside portion of the contact groove 24 and over almost the entire area of the device formation surface 1a of the wafer 1. Thereafter, by ordinary lithography, a source metal electrode 5 formed of the aluminum-based source metal film 5a and the barrier metal film 5b is subjected to patterning.

Then, as shown in FIG. 22 for example, a final passivation film 11 such as a polyimide-based organic film having a thickness of approximately 2.5 micrometers is applied to almost the entire area of the device formation surface 1a of the wafer 1.

Then, as shown in FIG. 23 for example, by ordinary lithography, the final passivation film 11 is partially removed, i.e., the parts thereof corresponding to the source pad opening 7 and the gate pad opening 8 indicated in FIG. 1 and such periphery parts thereof as indicated in FIGS. 4, 5, 25, and 26 are removed.

Then, as shown in FIG. 3 (FIG. 24), back-grinding is performed for the back surface 1b of the wafer 1. Thus, for example, a wafer thickness of approximately 800 micrometers is reduced to a range from 200 to 30 micrometers as required. Thereafter, a back surface electrode 13 is formed through a sputtering film formation process or the like. Further, the wafer 1 thus processed is divided into individual chips 2 through such a process as dicing.

4. Description of Modified Arrangement of First/Second Preferred Embodiment (Source-Coupling-Type Structure)

Figure 30:
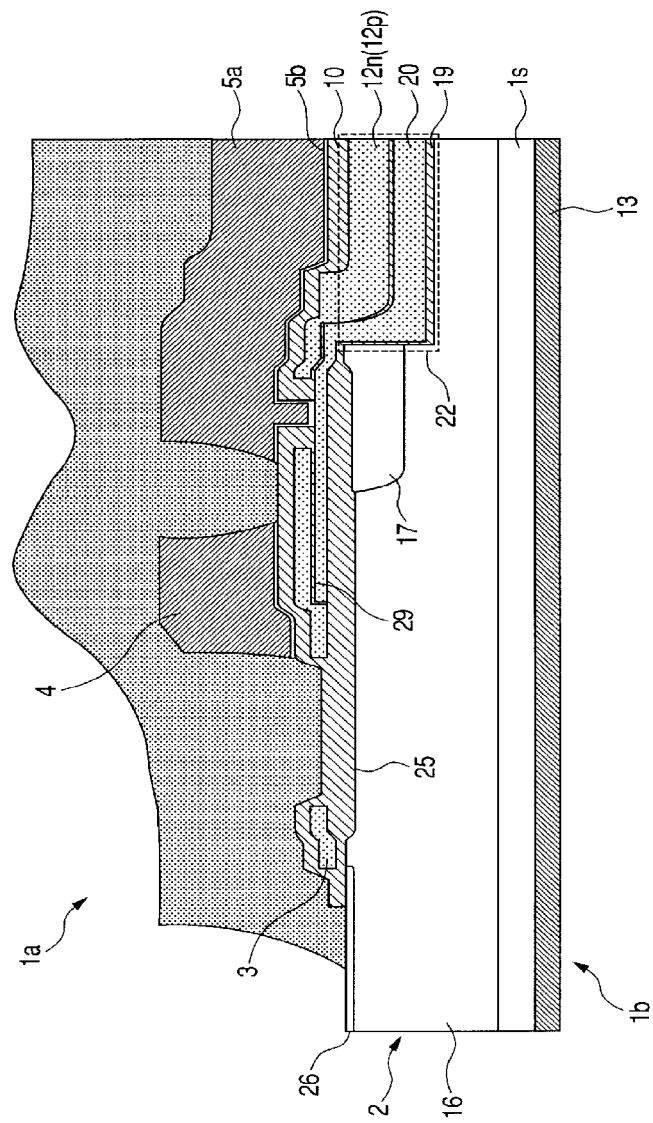
FIG. 30 is a device cross-sectional view taken along line Y"-Y of FIG. 1 in a modified arrangement (source-coupling-type structure) of the first preferred embodiment (second preferred embodiment) of the present invention.

With Primary Reference to FIG. 30

The following describes a source-coupling-type structure that is a modification of the gate-coupling-type structure in the first and second preferred embodiments explained in Sections 1 to 3.

Referring to FIG. 30, there is shown a device cross-section taken along line Y'''-Y of FIG. 1 in a modified arrangement (source-coupling-type structure) of the first (second) preferred embodiment of the present invention. Note that configurations other than those shown in FIG. 30 are similar to those described in Sections 1 to 4. For the sake of simplicity, no duplicative description is given here.

As shown in FIG. 30, the field plate electrode 20 is coupled to the source electrode via the source metal electrode 5 (or the metal wiring line in the same layer) outside the trench.

5. Supplementary Description Regarding First and Second Preferred Embodiments With Primary Reference to FIGS. 27 to 29

The following describes characteristic data of NBT (negative bias temperature) threshold voltage variations in each preferred embodiment explained hereinabove.

Figure 27:
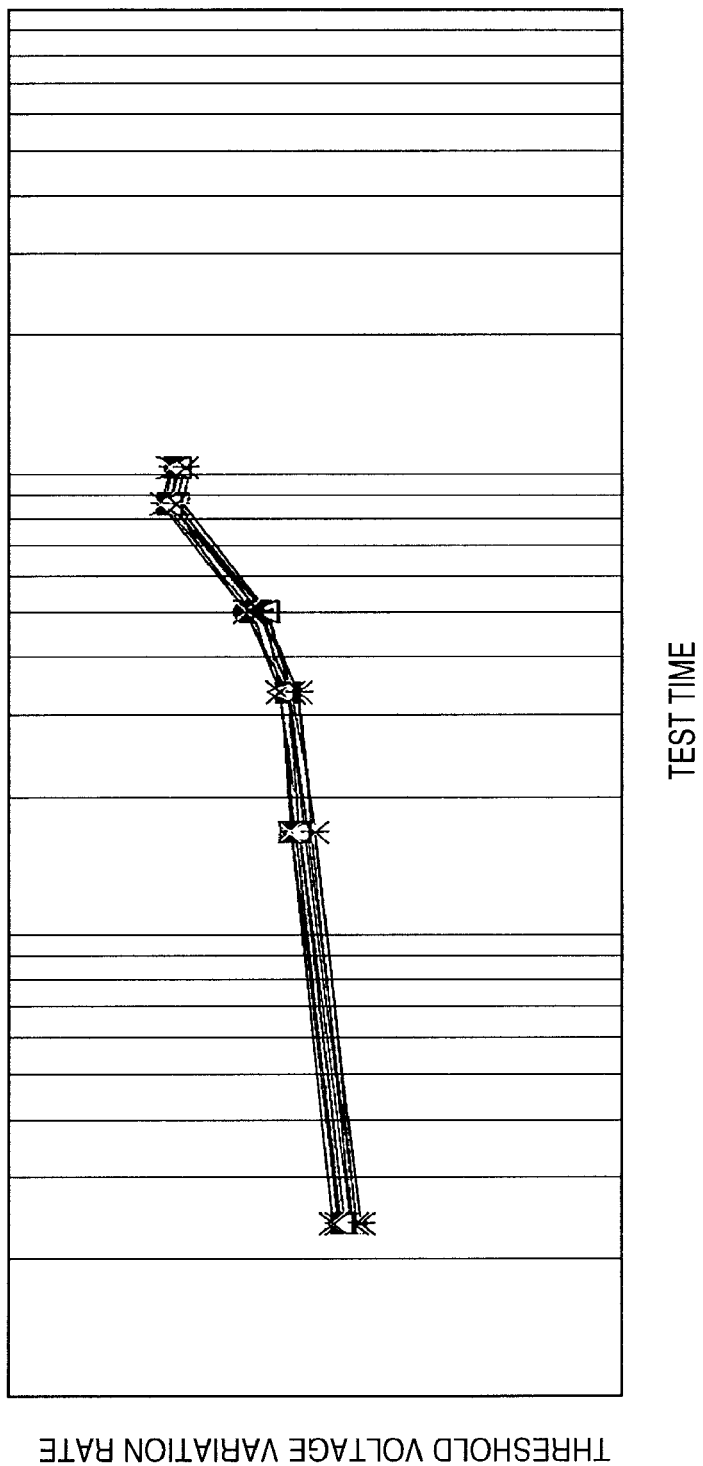
FIG. 27 is a plot graph showing NBT threshold voltage variation characteristic data of comparative example devices each having a p-type trench gate electrode and a p-type field plate electrode.
Figure 28:
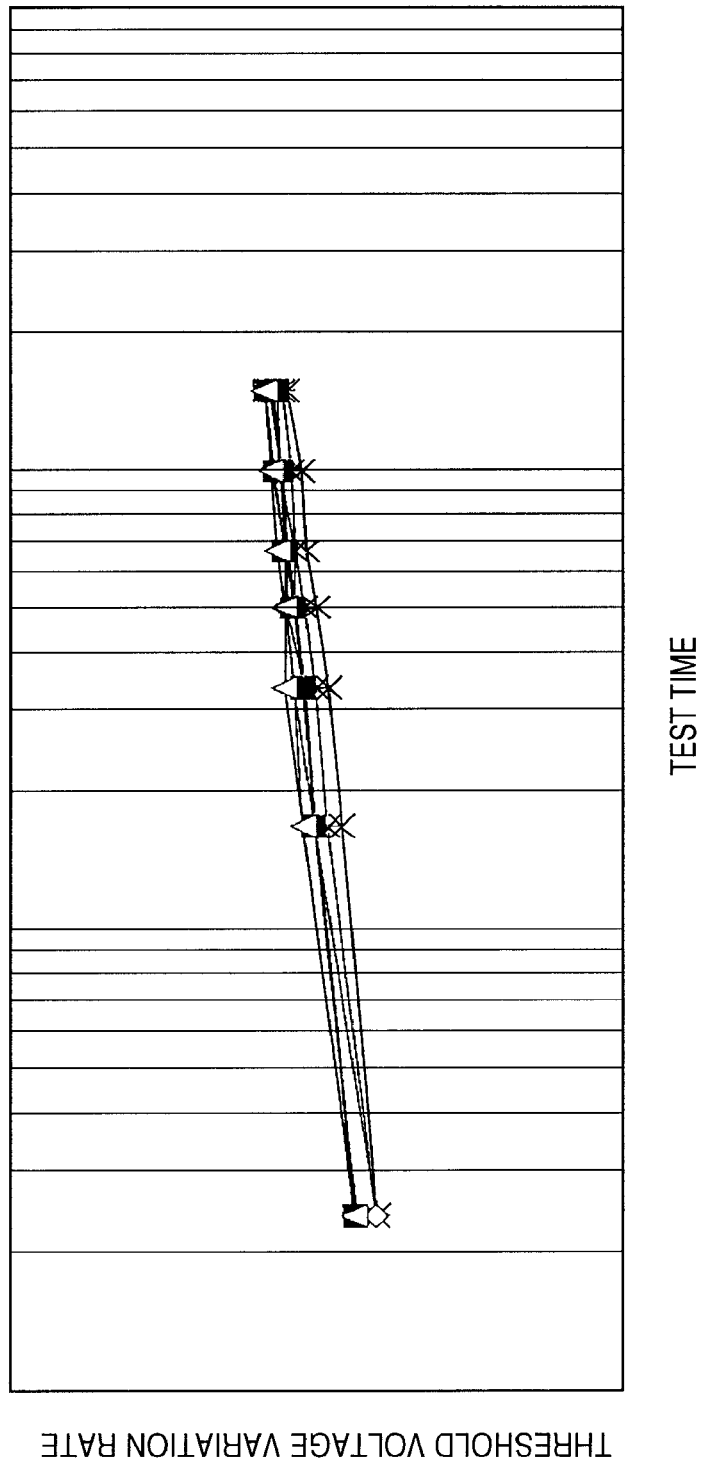
FIG. 28 is a plot graph showing NBT threshold voltage variation characteristic data of devices each having an n-type trench gate electrode and an n-type field plate electrode according to the first preferred embodiment of the present invention.
Figure 29:
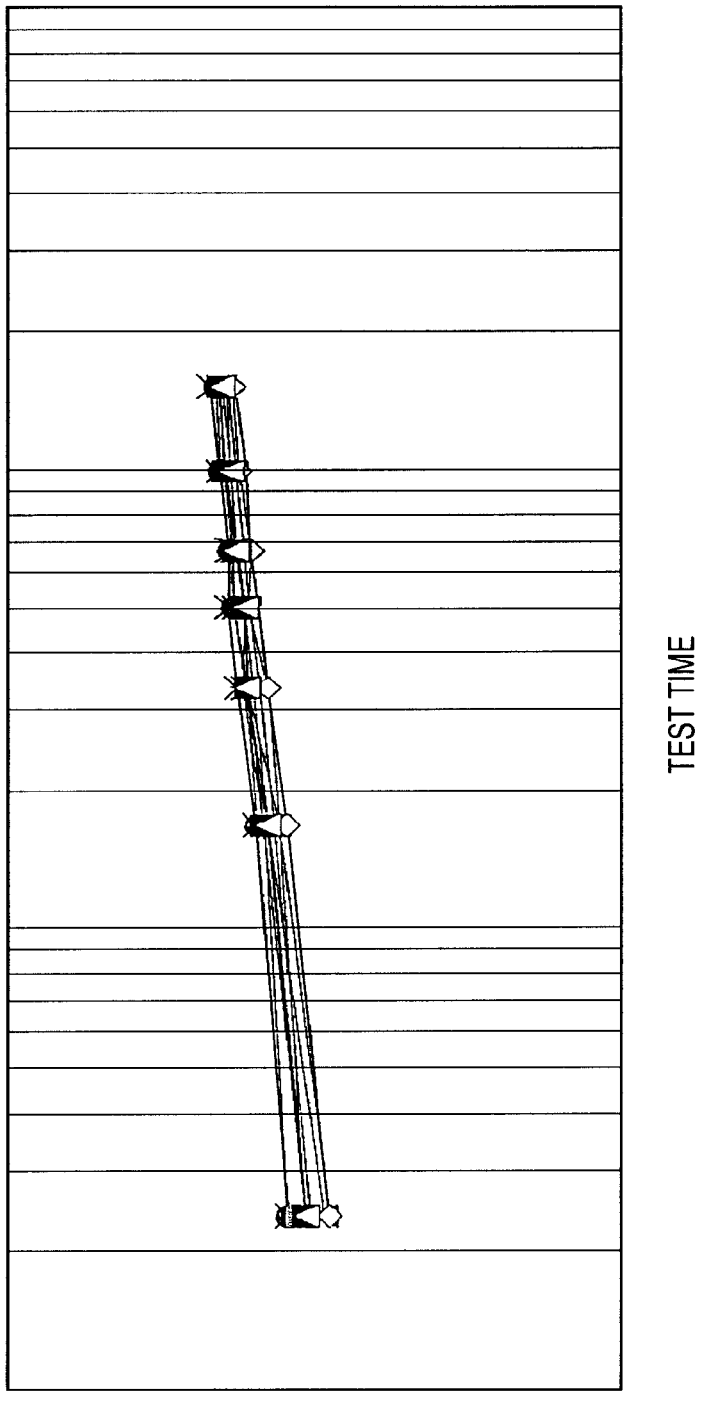
FIG. 29 is a plot graph showing NBT threshold voltage variation characteristic data of devices each having a p-type trench gate electrode and an n-type field plate electrode according to the second preferred embodiment of the present invention.

FIG. 27 shows a characteristic data plot graph of NBT threshold voltage variations in comparative example devices each having a p-type trench gate electrode and a p-type field plate electrode. FIG. 28 shows a characteristic data plot graph of NBT threshold voltage variations in devices each having an n-type trench gate electrode and an n-type field plate electrode according to the first preferred embodiment of the present invention. FIG. 29 shows a characteristic data plot graph of NBT threshold voltage variations in devices each having a p-type trench gate electrode and an n-type field plate electrode according to the second preferred embodiment of the present invention.

As shown in FIG. 27, in the comparative example devices (configured by simple replacement with p-type polysilicon electrodes), the threshold voltage has increased steeply after the lapse of a certain period of test time. Contrastingly, as shown in FIG. 28, in the devices configured according to the first preferred embodiment, the threshold voltage has increased just gradually with a constant slope regardless of the length of test time. On the other hand, as shown in FIG. 29, in the devices configured according to the second preferred embodiment, while the threshold voltage has increased just gradually with a constant slope regardless of the length of test time similarly to the case of the first preferred embodiment, the threshold voltage variation rate has been slightly higher than that of the first preferred embodiment on the whole. This tendency of a relatively higher level in variation rate could be attributed to the influence of boron contained in the p-type trench gate at a substantial degree of concentration.

Hence, based on the data mentioned above, the features of the present invention can be enumerated as follows: (1) The device structure according to the first preferred embodiment is most advantageous in that threshold voltage variations with time can be reduced effectively in terms of gate-bias-related device characteristic. (2) In the case of a low-threshold-voltage device arrangement, however, it is disadvantageously required to decrease a level of channel region dopant concentration. (3) In view of this condition, the device structure according to the second preferred embodiment is suitable for application to a low-threshold-voltage device. It will be obvious to those skilled in the art that a low-threshold-voltage device can be fabricated by providing necessary adjustments in the first preferred embodiment.

6. Summary

While the present invention made by the present inventors has been described in detail with respect to specific embodiments thereof, it is to be understood that the present invention is not limited by any of the details of description and that various changes and modifications may be made in the present invention without departing from the spirit and scope thereof.

For example, while specific examples using doped polysilicon materials for layer formation have been taken in the foregoing description of the preferred embodiments, the present invention is not limited thereto, and there may be provided such an arrangement that nondoped polysilicon is applied to formation of at least one layer, and then after completion of film formation, a dopant is added by ion implantation or the like. In this case, it is possible to increase the degree of process freedom by using nondoped silicon for forming an ESD-protection polysilicon diode as an optional device element, for example, whereas it is inevitable to incur an increase in process cost. Contrastingly, in the use of doped polysilicon, it is possible to form a low-resistance polysilicon layer with relative ease though the degree of process freedom is sacrificed to a certain extent.

Further, while the foregoing preferred embodiments have been described as related to a power MOSFET having a double-gate-in-trench structure, the present invention is not limited thereto and may also be applied to an IGBT (Insulated Gate Bipolar Transistor) having a double-gate-in-trench structure, for example.

What is claimed is:

1. A method of manufacturing a double-gate-in-trench p-channel power MOSFET with reduced negative bias temperature instability, comprising the steps of:
   (a) providing a p-type silicon-based semiconductor substrate having first and second principal surface sides;
   (b) forming a p-type silicon epitaxial region over the first principal surface side of the p-type silicon-based semiconductor substrate, the p-type silicon epitaxial region constituting a drain region of the p-channel power MOSFET;
   (c) forming an n-type well region in the p-type silicon epitaxial region, the n-type well region constituting a channel region of the p-channel MOSFET;
   (d) forming a p-type impurity region in the n-type well region, the p-type impurity region constituting a source region of the p-channel power MOSFET;
   (e) forming a pair of linear trenches in the p-type silicon epitaxial region, the pair of linear trenches extending through both of the n-type well region and the p-type impurity region;
   (f) forming a linear contact groove in the n-type well region between the pair of linear trenches and extending through the p-type impurity region;
   (g) forming an n-type contact region in the n-type well region between the pair of linear trenches and adjacent to a bottom portion of the linear contact groove, and
   (h) providing a gate structure configured in accordance with an arrangement that has been predetermined to reduce negative bias temperature instability, said gate structure comprising, in each of the linear trenches:
      an n-type polysilicon linear field plate electrode that extends from the p-type silicon epitaxial region into the n-type well region;
      an n-type polysilicon linear gate electrode that extends from the p-type silicon epitaxial region, through the n-type well region and into the p-type impurity region, and is disposed over and along the n-type polysilicon linear field plate electrode; and
      a gate insulating film formed between the n-type polysilicon linear gate electrode and the n-type well region.

2. A method according to claim 1,
   wherein the second principal surface side of the silicon-based semiconductor substrate is provided with a metal drain electrode.

3. A method according to claim 2,
   wherein the n-type polysilicon linear field plate electrode and the n-type polysilicon linear gate electrode are electrically coupled to each other.

4. A method according to claim 3,
   wherein the n-type polysilicon linear field plate electrode and the n-type polysilicon linear gate electrode are coupled with each other outside each linear trench.

5. A method according to claim 4,
   wherein the n-type polysilicon linear field plate electrode and the n-type polysilicon linear gate electrode are coupled with each other via a metal wiring line outside each linear trench.

6. A method according to claim 5,
   wherein the p-channel power MOSFET is arranged for motor driving use.

7. A method according to claim 6,
   wherein the p-channel power MOSFET is arranged for use as a low-threshold-voltage device.

8. A method according to claim 1, wherein step (c) is performed after steps (e) and (h).

9. A method of manufacturing a double-gate-in-trench p-channel power MOSFET with reduced negative bias temperature instability, comprising the steps of:
- (a) providing a p-type silicon-based semiconductor substrate having first and second principal surface sides;
- (b) after step (a), forming a p-type silicon epitaxial region over the first principal surface side of the p-type silicon-based semiconductor substrate, the p-type silicon epitaxial region constituting a drain region of the p-channel power MOSFET;
- (c) after step (b), forming a pair of linear trenches in the p-type silicon epitaxial region;
- (d) after step (c), configuring a gate structure in accordance with an arrangement that has been predetermined to reduce negative bias temperature instability, the gate structure including an n-type polysilicon linear field plate electrode and an n-type polysilicon linear gate electrode, and the step (d) including, in each of the linear trenches:
  - (d1) forming a first insulating film corresponding to a periphery of the n-type polysilicon linear field plate electrode over a lower portion of an inside surface of the trench;
  - (d2) after step (d1), forming the n-type polysilicon linear field plate electrode in the lower portion of the trench so as to be surrounded by the first insulating film;
  - (d3) after step (d2), forming a second insulating film corresponding to a periphery of the n-type polysilicon linear gate electrode over an upper portion of the inside surface of the trench; and
  - (d4) after step (d3), forming an n-type polysilicon linear gate electrode in the upper portion of the trench over and along an upper portion of the n-type polysilicon linear field plate electrode, so as to be surrounded by the second insulating film;
- (e) after step (d), forming an n-type well region in the p-type silicon epitaxial region between the pair of linear trenches, the n-type well region constituting a channel region of the p-channel MOSFET;
- (f) after step (e), forming a p-type impurity region in the n-type well region, the p-type impurity constituting a source region of the p-channel MOSFET;
- (g) after step (f), forming a linear contact groove in the n-type well region between the pair of linear trenches and extending through the p-type impurity region;
- (h) after step (g), forming an n-type contact region in the n-type well region between the pair of linear trenches and adjacent to a bottom portion of the linear contact groove.

10. A method according to claim 9,
wherein the second principal surface side of the silicon-based semiconductor substrate is provided with a metal drain electrode.

11. A method according to claim 10,
wherein the n-type polysilicon linear field plate electrode and the n-type polysilicon linear gate electrode are electrically coupled to each other.

12. A method according to claim 11,
wherein the n-type polysilicon linear field plate electrode and the n-type polysilicon linear gate electrode are coupled with each other outside each linear trench.

13. A method according to claim 12,
wherein the n-type polysilicon linear field plate electrode and the n-type polysilicon linear gate electrode are coupled with each other via a metal wiring line outside each linear trench.

14. A method according to claim 13,
wherein the p-channel power MOSFET is arranged for motor driving use.

15. A method according to claim 14,
wherein the p-channel power MOSFET is arranged for use as a low-threshold-voltage device.

* * * * *